United States Patent
Lim

(10) Patent No.: US 8,085,587 B2
(45) Date of Patent: Dec. 27, 2011

(54) NON-VOLATILE MEMORY DEVICE AND METHOD OF VERIFYING A PROGRAM OPERATION IN THE SAME

(75) Inventor: Kyu Hee Lim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 428 days.

(21) Appl. No.: 12/362,458

(22) Filed: Jan. 29, 2009

(65) Prior Publication Data

US 2009/0285021 A1  Nov. 19, 2009

(30) Foreign Application Priority Data

May 13, 2008  (KR) ........................ 10-2008-0044127

(51) Int. Cl.
*G11C 16/04* (2006.01)
(52) U.S. Cl. ......... 365/185.03; 365/185.05; 365/185.18; 365/185.22; 365/185.24; 365/203; 365/205
(58) Field of Classification Search ............. 365/185.03, 365/185.05, 185.18, 185.22, 185.24, 203, 365/205
See application file for complete search history.

(56) References Cited

U.S. PATENT DOCUMENTS

| | | | | |
|---|---|---|---|---|
| 6,643,180 | B2 * | 11/2003 | Ikehashi et al. | 365/185.22 |
| 6,650,570 | B2 * | 11/2003 | Tanzawa et al. | 365/185.22 |
| 7,539,057 | B2 * | 5/2009 | Hwang et al. | 365/185.19 |
| 7,577,030 | B2 * | 8/2009 | Tokiwa et al. | 365/185.03 |
| 7,796,440 | B2 * | 9/2010 | Lee | 365/185.22 |
| 7,978,532 | B2 * | 7/2011 | Hwang et al. | 365/185.29 |

FOREIGN PATENT DOCUMENTS

| | | |
|---|---|---|
| KR | 1020070010305 A | 1/2007 |
| KR | 100816155 B1 | 3/2008 |

OTHER PUBLICATIONS

Notice of Preliminary Rejection issued from Korean Intellectual Property Office on Feb. 16, 2010.

* cited by examiner

*Primary Examiner* — Viet Q Nguyen
(74) *Attorney, Agent, or Firm* — IP & T Group LLP

(57) ABSTRACT

A page buffer in a non-volatile memory device for performing a program operation for a multi level cell having m bits includes first register to mth registers, a first data transmitting circuit configured to transmit data stored in a first node or a second node of the first register to a sensing node in accordance with a first data transmitting signal or a second data transmitting signal, and (m−1) sensing node discharging circuits configured to couple the sensing node to ground in accordance with data stored in a first node or a second node of each of the second to mth registers, and a first sensing node discharge signal or a second sensing node discharge signal.

55 Claims, 14 Drawing Sheets

| State | CB_N | MB_N | TB_N |
|---|---|---|---|
| Third state | 1 | 1 | 1 |
| Fourth state | 1 | 0 | 0 |
| Fifth state | 0 | 0 | 1 |
| Sixth state | 0 | 0 | 0 |

FIG. 13
| State | CB_N | MB_N | F1B_N | F2B_N |
|---|---|---|---|---|
| Seventh state | 1 | 1 | 1 | 0 |
| Eighth state | 1 | 0 | 1 | 1 |
| Ninth state | 1 | 0 | 0 | 1 |
| Tenth state | 1 | 0 | 0 | 0 |
| Eleventh state | 0 | 0 | 1 | 0 |
| Twelfth state | 0 | 0 | 1 | 1 |
| Thirteenth state | 0 | 0 | 0 | 1 |
| Fourteenth state | 0 | 0 | 0 | 0 |
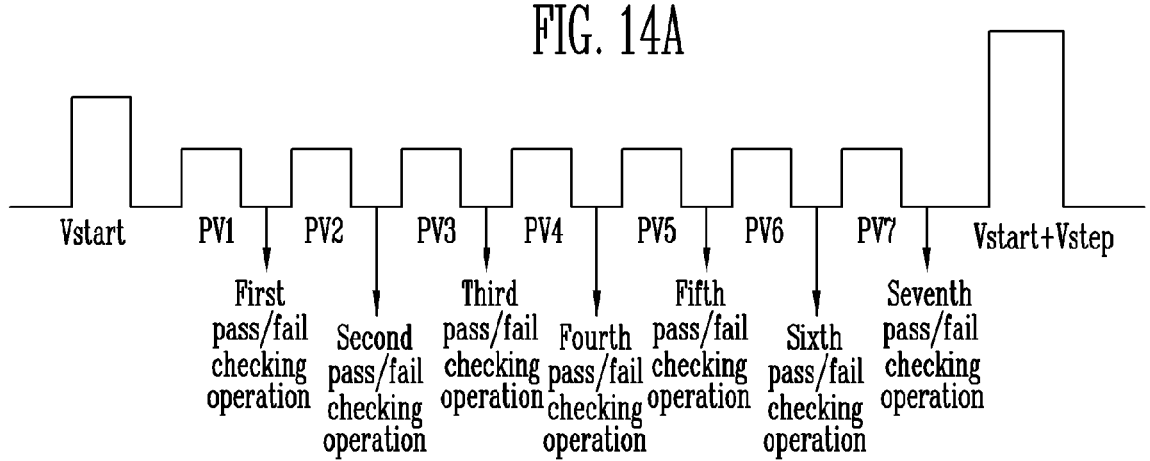
FIG. 14A
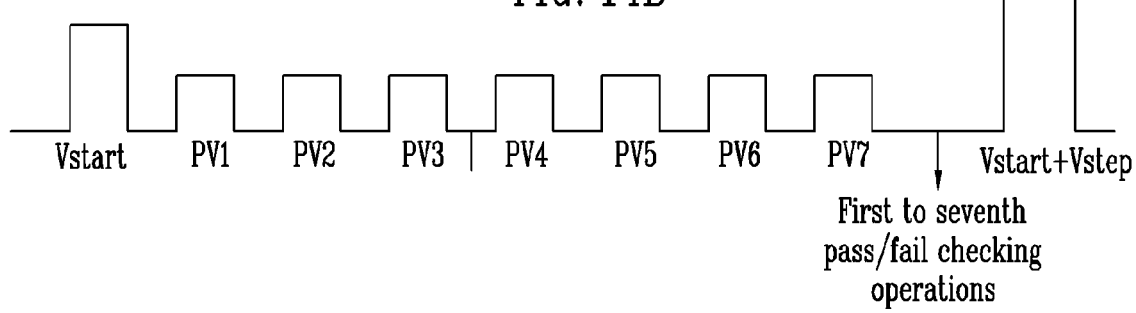
FIG. 14B

FIG. 15

| | First verifying operation | Second verifying operation | Third verifying operation | Fourth verifying operation | Fifth verifying operation | Sixth verifying operation | Seventh verifying operation | ALL Check |
|---|---|---|---|---|---|---|---|---|
| CB_N | 1 | 1 | 1 | 0 | 0 | 0 | 0 | x |
| F1B_N | 1 | 0 | 1 | 1 | 1 | 0 | 0 | x |
| F2B_N | 0 | 1 | 0 | 0 | 1 | 1 | 0 | x |
| F1SOSET | L | H | H | L | L | H | H | L |
| F1SOSET_N | H | L | L | H | H | L | L | L |
| F2SOSET | H | L | H | H | L | L | H | L |
| F2SOSET_N | L | H | L | L | H | H | L | L |
| CTRAN | H | H | H | H | H | L | L | |
| CTRAN_N | L | L | L | L | L | H | H | |

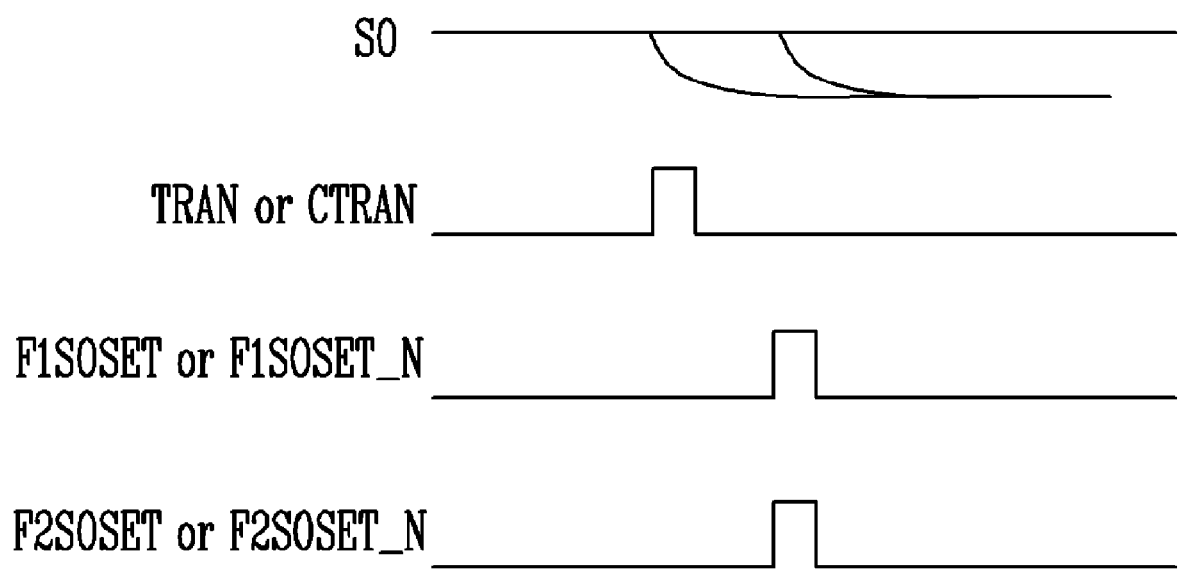

NON-VOLATILE MEMORY DEVICE AND METHOD OF VERIFYING A PROGRAM OPERATION IN THE SAME

CROSS-REFERENCE TO RELATED APPLICATION

This application claims priority from Korean Patent Application No. 10-2008-0044127, filed on May 13, 2008, the contents of which are incorporated herein by reference in its entirety.

BACKGROUND OF THE INVENTION

The present invention relates to a non-volatile memory device and a method of verifying a program operation in the same.

Recently, the demand has increased for a non-volatile memory device which electrically programs and erases data, and does not require a refresh function of periodically rewriting data.

The non-volatile memory device performs a program operation and an erase operation by changing a threshold voltage of a memory cell through moving of electrons by high electric field applied to a thin oxide film.

The non-volatile memory device includes generally a memory cell array in which memory cells for storing data are disposed in a matrix, and a page buffer for programming data in a specific memory cell of the memory cell array or reading data from a certain memory cell.

The page buffer has a pair of bit lines connected to a corresponding memory cell, a register for storing temporarily data to be programmed in the memory cell array or data read from a given memory cell, a sensing node for sensing voltage level of a specific bit line or a certain register, and a bit line select circuit for controlling connection of the bit line and the sensing node.

Increased storage capacity of the non-volatile memory device has also been required, and so a method of programming a multi level cell has been developed.

In the above method, a given memory cell has at least two different threshold voltage distributions in accordance with one program operation.

For example, in a method of programming a multi level cell having 2 bits, four threshold voltage distributions are generated. In this case, a program pulse is applied once in accordance with an incremental step pulse program ISPP method, and then two or three verifying operations are performed.

That is, two or three verifying operations are performed when a most significant bit MSB program is performed after a least significant bit LSB program is finished. Accordingly, the time for the verifying operation is increased.

SUMMARY OF THE INVENTION

It is a feature of the present invention to provide a non-volatile memory device for independently performing verifying operations so as to minimize time required for the verifying operations.

It is another feature of the present invention to provide a method of verifying a program operation in a non-volatile memory device that performs independent verifying operations.

A page buffer in a non-volatile memory device according to one exemplary embodiment of the present invention includes first register to third registers; a first data transmitting circuit configured to transmit data stored in a first node or a second node of the first register to a sensing node in accordance with a first data transmitting signal or a second data transmitting signal; and a sensing node discharging circuit configured to couple the sensing node to a ground in accordance with data stored in a first node or a second node of the third register, and a first sensing node discharge signal or a second sensing node discharge signal.

A page buffer in a non-volatile memory device for performing a program operation for a multi level cell having m bits according to another exemplary embodiment of the present invention includes first register to mth registers; a first data transmitting circuit configured to transmit data stored in a first node or a second node of the first register to a sensing node in accordance with a first data transmitting signal or a second data transmitting signal; and (m−1) sensing node discharging circuits configured to couple the sensing node to a ground in accordance with data stored in a first node or a second node of each of the second register to the mth register, and a first sensing node discharge signal or a second sensing node discharge signal.

A page buffer in a non-volatile memory device according to still another exemplary embodiment of the present invention includes first register to fifth registers; a first data transmitting circuit configured to transmit data stored in a first node or a second node of the first register to a corresponding sensing node in accordance with a first data transmitting signal or a second data transmitting signal; a first sensing node discharging circuit configured to couple a corresponding sensing node to the ground in accordance with data stored in a first node or a second node of the fourth register, and a first sensing node discharge signal or a second sensing node discharge signal; and a second sensing node discharging circuit configured to couple a corresponding sensing node to the ground in accordance with data stored in a first node or a second node of the fifth register, and a third sensing node discharge signal or a fourth sensing node discharge signal.

A method of verifying a program operation in a non-volatile memory device according to one exemplary embodiment of the present invention includes detecting levels of threshold voltages of program object memory cells by applying a first verifying voltage; coupling sensing nodes coupled to memory cells except a first verifying operation object memory cells to a ground; converting data stored in a register in accordance with a state of the first verifying operation object memory cells; precharging sensing nodes coupled to every memory cell to high level; coupling the sensing nodes coupled to the memory cells except the first verifying operation object memory cells; and verifying pass/fail of a verifying operation in accordance with the data stored in the register coupled to the first verifying operation object memory cells.

A method of verifying a program operation in a non-volatile memory device according to another exemplary embodiment of the present invention includes performing a program operation in accordance with a first program voltage; performing a first verifying operation by applying a first verifying voltage; verifying pass/fail of the first verifying operation in accordance with data stored in a second register coupled to first verifying operation object memory cells; performing a second verifying operation by applying a second verifying voltage; verifying pass/fail of the second verifying operation in accordance with the data stored in the second register coupled to second verifying operation object memory cells; performing a third verifying operation by applying a third verifying voltage; and verifying pass/fail of the third verifying operation in accordance with the data stored in the second register coupled to third verifying operation object memory cells. Here, the steps of performing the verifying operations and the steps of verifying the pass/fail include coupling a sensing node coupled to memory cells except a corresponding verifying operation object memory cells to a ground.

A method of verifying a program operation in a non-volatile memory device according to still another exemplary embodiment of the present invention includes performing a program operation in accordance with a first program voltage; performing a first verifying operation by applying a first verifying voltage; performing a second verifying operation by applying a second verifying voltage; performing a third verifying operation by applying a third verifying voltage; verifying pass/fail of the first verifying operation in accordance with data stored in a second register coupled to first verifying operation object memory cells; verifying pass/fail of the second verifying operation in accordance with the data stored in the second register coupled to second verifying operation object memory cells; and verifying pass/fail of the third verifying operation in accordance with the data stored in the second register coupled to third verifying operation object memory cells. Here, the steps of performing the verifying operations and the steps of verifying the pass/fail include coupling a sensing node coupled to memory cells except a corresponding verifying operation object memory cells to a ground.

A method of verifying a program operation in a non-volatile memory device according to still another exemplary embodiment of the present invention includes performing a program operation in accordance with a first program voltage; performing a first verifying operation by applying a first verifying voltage; verifying pass/fail of the first verifying operation in accordance with data stored in a second register coupled to first verifying operation object memory cells; performing a second verifying operation by applying a second verifying voltage; verifying pass/fail of the second verifying operation in accordance with the data stored in the second register coupled to second verifying operation object memory cells; performing a third verifying operation by applying a third verifying voltage; verifying pass/fail of the third verifying operation in accordance with the data stored in the second register coupled to third verifying operation object memory cells; performing a fourth verifying operation by applying a fourth verifying voltage; verifying pass/fail of the fourth verifying operation in accordance with the data stored in the second register coupled to fourth verifying operation object memory cells; performing a fifth verifying operation by applying a fifth verifying voltage; verifying pass/fail of the fifth verifying operation in accordance with the data stored in the second register coupled to fifth verifying operation object memory cells; performing a sixth verifying operation by applying a third verifying voltage; verifying pass/fail of the sixth verifying operation in accordance with the data stored in the second register coupled to sixth verifying operation object memory cells; performing a seventh verifying operation by applying a seventh verifying voltage; and verifying pass/fail of the seventh verifying operation in accordance with the data stored in the second register coupled to seventh verifying operation object memory cells. Here, the steps of performing the verifying operations and the steps of verifying the pass/fail include coupling a sensing node coupled to memory cells except a corresponding verifying operation object memory cells to a ground.

A method of verifying a program operation in a non-volatile memory device according to still another exemplary embodiment of the present invention includes performing a program operation in accordance with a first program voltage; performing a first verifying operation by applying a first verifying voltage; performing a second verifying operation by applying a second verifying voltage; performing a third verifying operation by applying a third verifying voltage; performing a fourth verifying operation by applying a fourth verifying voltage; performing a fifth verifying operation by applying a fifth verifying voltage; performing a sixth verifying operation by applying a sixth verifying voltage; performing a seventh verifying operation by applying a seventh verifying voltage; verifying pass/fail of the first verifying operation in accordance with data stored in a second register coupled to first verifying operation object memory cells; verifying pass/fail of the second verifying operation in accordance with the data stored in the second register coupled to second verifying operation object memory cells; verifying pass/fail of the third verifying operation in accordance with the data stored in the second register coupled to third verifying operation object memory cells; verifying pass/fail of the fourth verifying operation in accordance with data stored in the second register coupled to fourth verifying operation object memory cells; verifying pass/fail of the fifth verifying operation in accordance with the data stored in the second register coupled to fifth verifying operation object memory cells; verifying pass/fail of the sixth verifying operation in accordance with the data stored in the second register coupled to sixth verifying operation object memory cells; and verifying pass/fail of the seventh verifying operation in accordance with the data stored in the second register coupled to seventh verifying operation object memory cells. Here, the steps of performing the verifying operations and the steps of verifying the pass/fail include coupling a sensing node coupled to memory cells except a corresponding verifying operation object memory cells to a ground.

As described above, verifying operations may be independently performed. That is, in case that a specific verifying operation of the verifying operations is completed, the specific verifying operation is no longer performed. Accordingly, time required for every verifying operation may be reduced.

BRIEF DESCRIPTION OF THE DRAWINGS

The above and other features and advantages of the present invention will become readily apparent by reference to the following detailed description when considered in conjunction with the accompanying drawings wherein:

FIG. 13 is a view illustrating a table indicating data set in each registers in a non-volatile memory device according to still another exemplary embodiment of the present invention;

FIG. 14A and FIG. 14B are views illustrating a verifying operation for a program operation in a non-volatile memory device according to one exemplary embodiment of the present invention;

FIG. 15 is a view illustrating a table recording control signals for coupling a sensing node to a ground according to one exemplary embodiment of the present invention; and FIG. 16 is a view illustrating waveforms of control signals in a verifying operation according to another exemplary embodiment of the present invention.

DESCRIPTION OF SPECIFIC EMBODIMENTS

Hereinafter, the preferred embodiments of the present invention will be explained in more detail with reference to the accompanying drawings.

Figure 1:
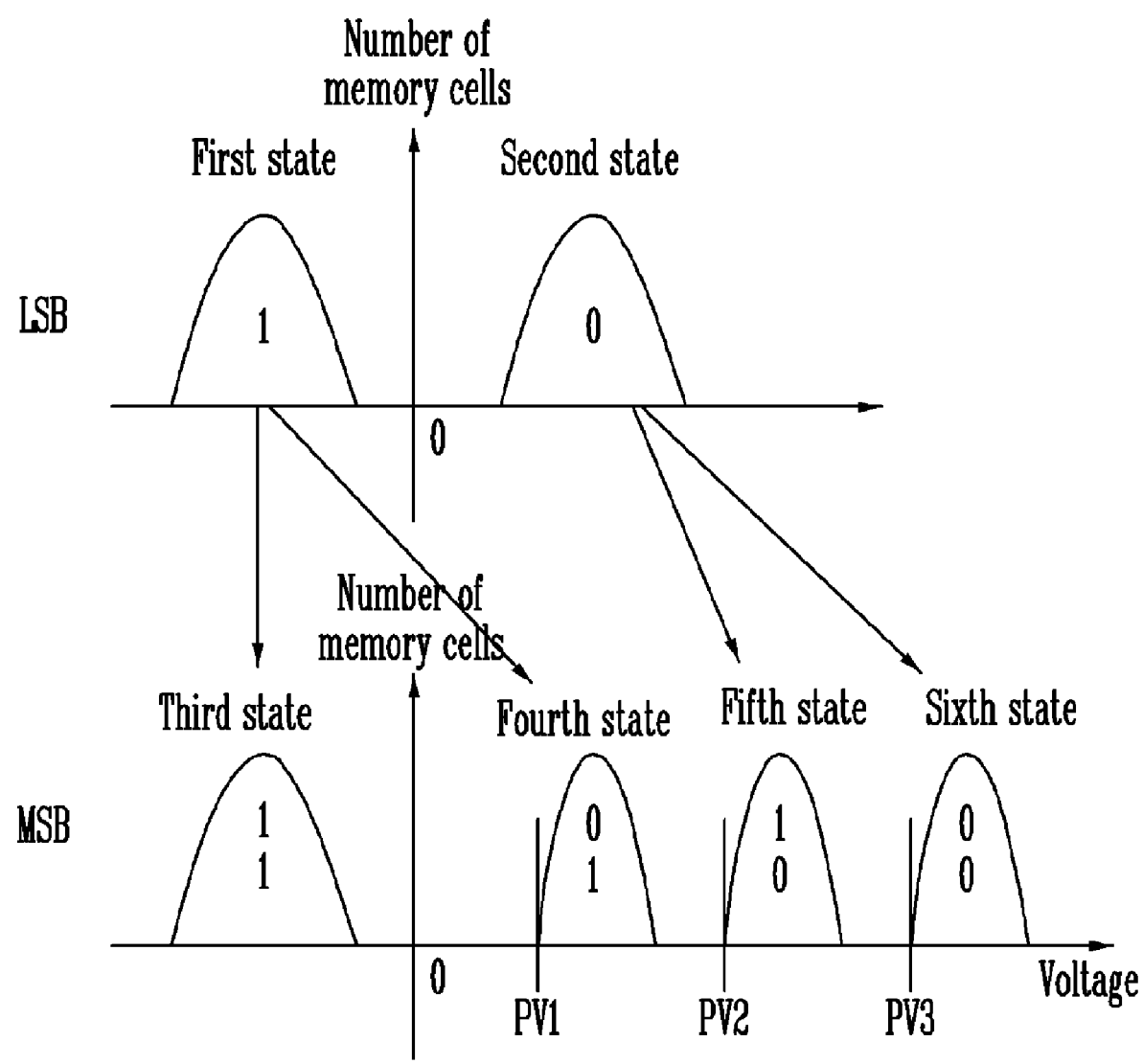
FIG. 1 is a view illustrating a method of programming a multi level cell in a non-volatile memory device according to one exemplary embodiment of the present invention.

FIG. 1 is a view illustrating a method of programming a multi level cell in a non-volatile memory device according to one exemplary embodiment of the present invention.

Two different distribution states, i.e. '1' and '0' are formed by an LSB program operation. In this case, the program operation/a verifying operation are performed in accordance with a common method of programming a single level cell.

Next, four different distribution states, i.e. '11', '01', '10' and '00' are formed by an MSB program operation. Particularly, a fourth distribution state '01' is formed by programming memory cells having first distribution state '1', and a sixth distribution state '00' is formed by programming memory cells having second distribution state '0'. In addition, memory cells not to be programmed have third distribution state '11'. In case of a fifth distribution state '10' corresponding to the memory cell not to be programmed, a verifying operation is performed on the basis of a second verifying voltage so as to ensure margin between adjoining distribution states.

On the other hand, since fourth different distribution states are formed by applying one time a program pulse in the MSB program operation, verifying operations for each of distribution states except the third state are performed. Here, since memory cells to be programmed to the third distribution state to the sixth distribution state are existed in one MSB page, the verifying operations should be separately performed in accordance with the distribution states. That is, a first verifying operation is performed about memory cells to be programmed to the fourth distribution state on the basis of a first verifying voltage PV1, and a second verifying operation is performed about memory cells to be programmed to the fifth distribution state on the basis of a second verifying voltage PV2. Additionally, a third verifying operation is performed about memory cells to be programmed to the sixth distribution state on the basis of a third verifying voltage PV3.

Hereinafter, the memory cells to be programmed to the fourth distribution state will be referred to as first verifying operation object memory cells, the memory cells to be programmed to the fifth distribution state are assumed to second verifying operation object memory cells, and the memory cells to be programmed to the sixth distribution state will be referred to as third verifying operation object memory cells.

On the other hand, it is discriminated through a pass/fail checking operation whether or not the verifying operations are completed after the verifying operations are performed.

In other words, in case that every memory cell to be programmed to a specific distribution state is programmed to a voltage more than a corresponding verifying voltage, a pass signal is outputted, and so a corresponding verifying operation may not be again performed. Accordingly, the completed verifying operation of every verifying operation may not be performed in each of program operations. The present invention provides this pass/fail checking operation.

Figure 2:
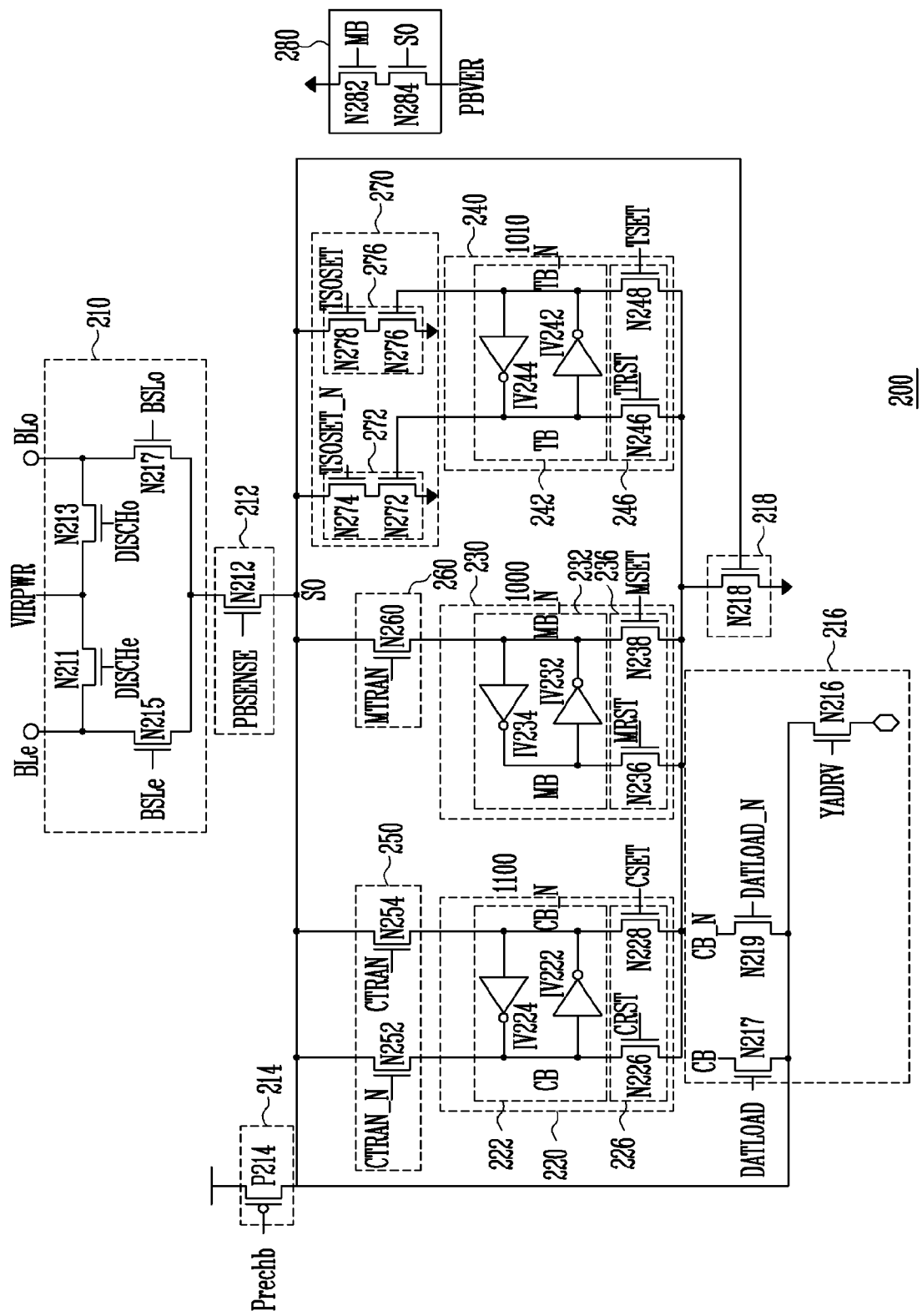
FIG. 2 is a view illustrating a page buffer in a non-volatile memory device according to one exemplary embodiment of the present invention.

FIG. 2 is a view illustrating a page buffer in a non-volatile memory device according to one exemplary embodiment of the present invention.

The page buffer 200 of the present embodiment includes a bit line select circuit 210, a bit line sensing circuit 212, a sensing node precharging circuit 214, a data inputting circuit 216, a sensing node sensing circuit 218, a first register 220, a second register 230, a third register 240, a first data transmitting circuit 250, a second data transmitting circuit 260, a sensing node discharging circuit 270, and a pass/fail checking circuit 280.

The bit line select circuit 210 has an N-MOS transistor N215 for coupling an even bit line BLe to a sensing node SO in response to a first bit line select signal BSLe and an N-MOS transistor N217 for coupling an odd bit line BLo to the sensing node SO in response to a second bit line select signal BSLo.

In addition, the bit line select circuit 210 further includes a variable voltage inputting terminal for applying a variable voltage VIRPWR having a specific level, an N-MOS transistor N211 for coupling the even bit line BLe to the variable voltage inputting terminal in response to a first discharge signal DISCHe, and an N-MOS transistor N213 for coupling the odd bit line BLo to the variable voltage inputting terminal in response to a second discharge signal DISCHo.

This bit line select circuit 210 may couple selectively a specific bit line to the sensing node SO.

The bit line sensing circuit 212 is turned on in response to a bit line sensing signal PBSENSE, and includes an N-MOS transistor N212 coupled between the bit line select circuit 210 and the sensing node SO.

This bit line sensing circuit 212 applies a sensing voltage to the sensing node SO when a verifying operation/a read operation is performed, thereby providing state of a specific memory cell to the sensing node SO.

In another exemplary embodiment of the present invention, the transistors N215 and N217 of the bit line select circuit 210 may play the role of the bit line sensing circuit 212. Here, the bit line sensing circuit 210 is not employed.

The sensing node precharging circuit 214 applies a voltage VDD having high level to the sensing node SO in response to a precharge signal Prechb.

This sensing node precharging circuit 214 includes a P-MOS transistor P214 coupled between the voltage VDD of a power supply terminal and the sensing node SO. Accordingly, the voltage VDD having high level is applied to the sensing node SO in response to the precharge signal Prechb having low level.

The data inputting circuit 216 receives data, and provides the received data to the first register 220. This data inputting circuit 216 includes an N-MOS transistor N216 for providing the data in accordance with an input driving signal YADRV, an N-MOS transistor N217 for transmitting the data to a first node CB of the first register 220 in accordance with a first data input signal DATALOAD, and an N-MOS transistor N219 for transmitting the data to a second node CB_N of the first register 220 in accordance with a second data input signal DATALOAD_N.

The sensing node sensing circuit 218 applies a ground voltage to each of the registers 220, 230 and 240 in accordance with a voltage level of the sensing node SO. This sensing node sensing circuit 218 includes an N-MOS transistor N218 and is coupled between each of the registers 220, 230 and 240 and a ground terminal, wherein a gate of the transistor N218 is coupled to the sensing node SO. Accordingly, the ground voltage is provided to each of the registers 220, 230 and 240 in accordance with the voltage level of the sensing node SO.

The first register 220 includes a latch circuit 222 for storing data and a data setting circuit 226 for providing the ground voltage supplied from the sensing node sensing circuit 218 to the latch circuit 222 in accordance with a data setting signal CRST or CSET.

The latch circuit 222 has a first inverter IV222 and a second inverter IV224, wherein an input terminal of the first inverter IV222 is coupled to an output terminal of the second inverter IV224, and an output terminal of the first inverter IV222 is coupled to an input terminal of the second inverter IV224.

The first node CB is a node between the input terminal of the first inverter IV222 and the output terminal of the second inverter IV224, and the second node CB_N is a node between the output terminal of the first inverter IV222 and the input terminal of the second inverter IV224. Accordingly, data stored in the first node CB is reversed to data stored in the second node CB_N.

The data setting circuit 226 includes an N-MOS transistor N226 for applying the ground voltage supplied from the sensing node sensing circuit 218 to the first node CB in accordance with the first data setting signal CRST, and an N-MOS transistor N228 for providing the ground voltage supplied from the sensing node sensing circuit 218 to the second node CB_N in accordance with the second data setting signal CSET.

The second register 230 has a latch circuit 232 for storing data and a data setting circuit 236 for providing the ground voltage supplied from the sensing node sensing circuit 218 to the latch circuit 232 in accordance with a data setting signal MRST or MSET.

The latch circuit 232 has a first inverter IV232 and a second inverter IV234, wherein an input terminal of the first inverter IV232 is coupled to an output terminal of the second inverter IV234, and an output terminal of the first inverter IV232 is coupled to an input terminal of the second inverter IV234.

The first node MB is a node between the input terminal of the first inverter IV232 and the output terminal of the second inverter IV234, and the second node MB_N is a node between the output terminal of the first inverter IV232 and the input terminal of the second inverter IV234. Accordingly, data stored in the first node MB is reversed to data stored in the second node MB_N.

The data setting circuit 236 includes an N-MOS transistor N236 for applying the ground voltage supplied from the sensing node sensing circuit 218 to the first node MB in accordance with the first data setting signal MRST, and an N-MOS transistor N238 for providing the ground voltage supplied from the sensing node sensing circuit 218 to the second node MB_N in accordance with the second data setting signal MSET.

The third register 240 has a latch circuit 242 for storing data and a data setting circuit 246 for providing the ground voltage supplied from the sensing node sensing circuit 218 to the latch circuit 242 in accordance with a data setting signal TRST or TSET.

The latch circuit 242 has a first inverter IV242 and a second inverter IV244, wherein an input terminal of the first inverter IV242 is coupled to an output terminal of the second inverter IV244, and an output terminal of the first inverter IV242 is coupled to an input terminal of the second inverter IV244.

The first node TB is a node between the input terminal of the first inverter IV242 and the output terminal of the second inverter IV244, and the second node TB_N is a node between the output terminal of the first inverter IV242 and the input terminal of the second inverter IV244. Accordingly, data stored in the first node TB is reversed to data stored in the second node TB_N.

The data setting circuit 246 includes an N-MOS transistor N246 for applying the ground voltage supplied from the sensing node sensing circuit 218 to the first node TB in accordance with the first data setting signal TRST, and an N-MOS transistor N248 for providing the ground voltage supplied from the sensing node sensing circuit 218 to the second node TB_N in accordance with the second data setting signal TSET.

The data transmitting circuit 250 includes an N-MOS transistor N252 for transmitting data stored in the first node CB of the first register 220 to the sensing node SO in accordance with a first data transmitting signal CTRAN_N and an N-MOS transistor N254 for transmitting data stored in the second node CB_N of the first register 220 to the sensing node SO in accordance with a second data transmitting signal CTRAN. Accordingly, the data stored in a specific node may be transmitted to the sensing node SO in accordance with a corresponding data transmitting signal.

The second data transmitting circuit 260 has an N-MOS transistor N260 for transmitting data stored in the second node MB_N of the second register 230 to the sensing node SO in accordance with a data transmitting signal MTRAN.

The sensing node discharging circuit 270 includes a first discharge circuit 272 for discharging the sensing node SO to a ground in accordance with a first sensing node discharge signal TSOSET_N and level of the first node TB of the third register 240, and a second discharge circuit 276 for discharging the sensing node to the ground in accordance with a second sensing node discharge signal TSOSET and level of the second node TB_N of the third register 240.

The first discharge circuit 272 has N-MOS transistors N272 and N274 coupled in series between the sensing node SO and the ground. Here, the first N-MOS transistor N272 coupled to the ground is turned on in accordance with level of the first node TB, and the second N-MOS transistor N274 coupled to the sensing node SO is turned on in accordance with level of the first sensing node discharge signal TSOSET_N. In another exemplary embodiment of the present invention, the first N-MOS transistor N272 coupled to the ground may be turned on in accordance with level of the first sensing node discharge signal TSOSET_N, and the second N-MOS transistor N274 coupled to the sensing node SO may be turned on in accordance with level of the first node TB. Accordingly, the sensing node SO is discharged to the ground only when the first sensing node discharge signal TSOSET_N is transmitted and data stored in the first node TB has high level.

The second discharge circuit 276 has N-MOS transistors N276 and N278 coupled in series between the sensing node SO and the ground. Here, the third N-MOS transistor N276 coupled to the ground is turned on in accordance with level of the second node TB_N, and the fourth N-MOS transistor N278 coupled to the sensing node SO is turned on in accordance with level of the second sensing node discharge signal TSOSET. In another exemplary embodiment of the present invention, the third N-MOS transistor N276 coupled to the ground may be turned on in accordance with level of the second sensing node discharge signal TSOSET, and the second N-MOS transistor N278 coupled to the sensing node SO may be turned on in accordance with level of the second node TB_N. Accordingly, the sensing node SO is discharged to the ground only when the second sensing node discharge signal TSOSET is transmitted and data stored in the second node TB_N has high level.

The pass/fail checking circuit 280 includes N-MOS transistors N282 and N284 coupled in series between the ground terminal and a verifying signal outputting terminal PBVER. Here, the first N-MOS transistor N282 is turned on in accordance with the first node MB of the second node 230, and the second N-MOS transistor N284 is turned on in accordance with the sensing node SO. Accordingly, in case that a voltage having high level is applied to the sensing node SO and data having high level is transmitted to the first node MB, the ground voltage is applied to the verifying signal outputting terminal PBVER. This means that the verifying operation is not completed, and so a fail signal is outputted.

Figures 3, 4:
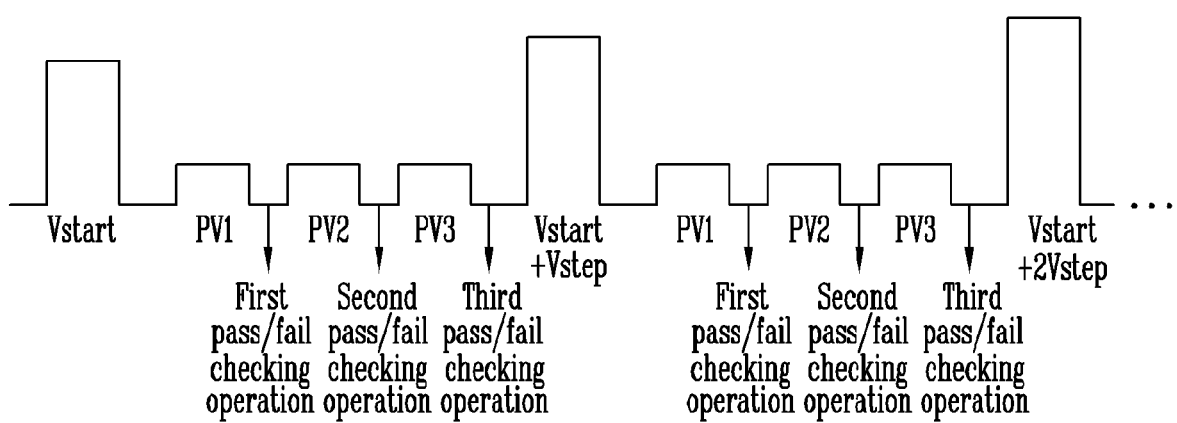
FIG. 3 is a view illustrating data stored in the registers in the non-volatile memory device according to one exemplary embodiment of the present invention.
FIG. 4 is a view illustrating a process of verifying a program operation in a non-volatile memory device according to one exemplary embodiment of the present invention.

FIG. 3 is a view illustrating data stored in the registers in the non-volatile memory device according to one exemplary embodiment of the present invention.

In case of maintaining a memory cell to the third state, data '1', '1' and '1' are stored in the second node CB_N of the first register 220, the second node MB_N of the second register 230 and the second node TB_N of the third register 240, respectively. In case of programming memory cells to the fourth state, the fifth state and the sixth state, data shown in a table are stored in a corresponding node.

On the other hand, the above setting may be modified in accordance with selection of a user. That is, the user may change the setting as long as the third state to the sixth state are identified in accordance with data stored in the first register 220 to the third register 240.

In case of performing an MSB program about the page about which the LSB program is finished, four states are existed as shown in FIG. 1.

In case that the user wants to maintain state of a specific memory cell to the third state, the user maintains the bit line to high level by using the data stored in the second register 230 though the program voltage is applied through the word line. As a result, a program inhibition operation is performed about the memory cell. That is, the data are set to perform the program inhibition operation about the memory cell.

In case that the user wants to program a given memory cell to the fourth state, the fifth state or the sixth state, the user changes level of the bit line to low level by using the data stored in the second register 230. As a result, the program operation is performed about the memory cell. In other words, the data are set to program the memory cell.

In brief, a memory cell to be programmed to the fifth state or the sixth state and the other memory cell are divided in accordance with the data stored in the first register 220. The data stored in the second register 230 verifies whether or not a memory cell corresponds to a program object memory cell. A memory cell to be programmed to the fourth state or the sixth state and the other memory cell are divided in accordance with the data stored in the third register 240. Accordingly, state of the memory cell may be specified as one of the third state to the sixth state by combining the data stored in the first register 220 to the fourth register 240.

Hereinafter, a method of verifying the program operation in the non-volatile memory device will be described in detail.

FIG. 4 is a view illustrating a process of verifying a program operation in a non-volatile memory device according to one exemplary embodiment of the present invention. FIG. 4 shows a process of performing an MSB program of a method of programming the MLC having 2 bits.

The program operation is performed in accordance with the ISPP method. Particularly, a program pulse is applied, and then a first verifying operation is performed on the basis of a first verifying voltage PV1. Subsequently, a second verifying operation is performed on the basis of a second verifying voltage PV2, and then a third verifying operation is performed on the basis of a third verifying voltage PV3. In addition, a pass/fail checking operation is performed whenever each of the verifying operations is performed.

Figure 5:
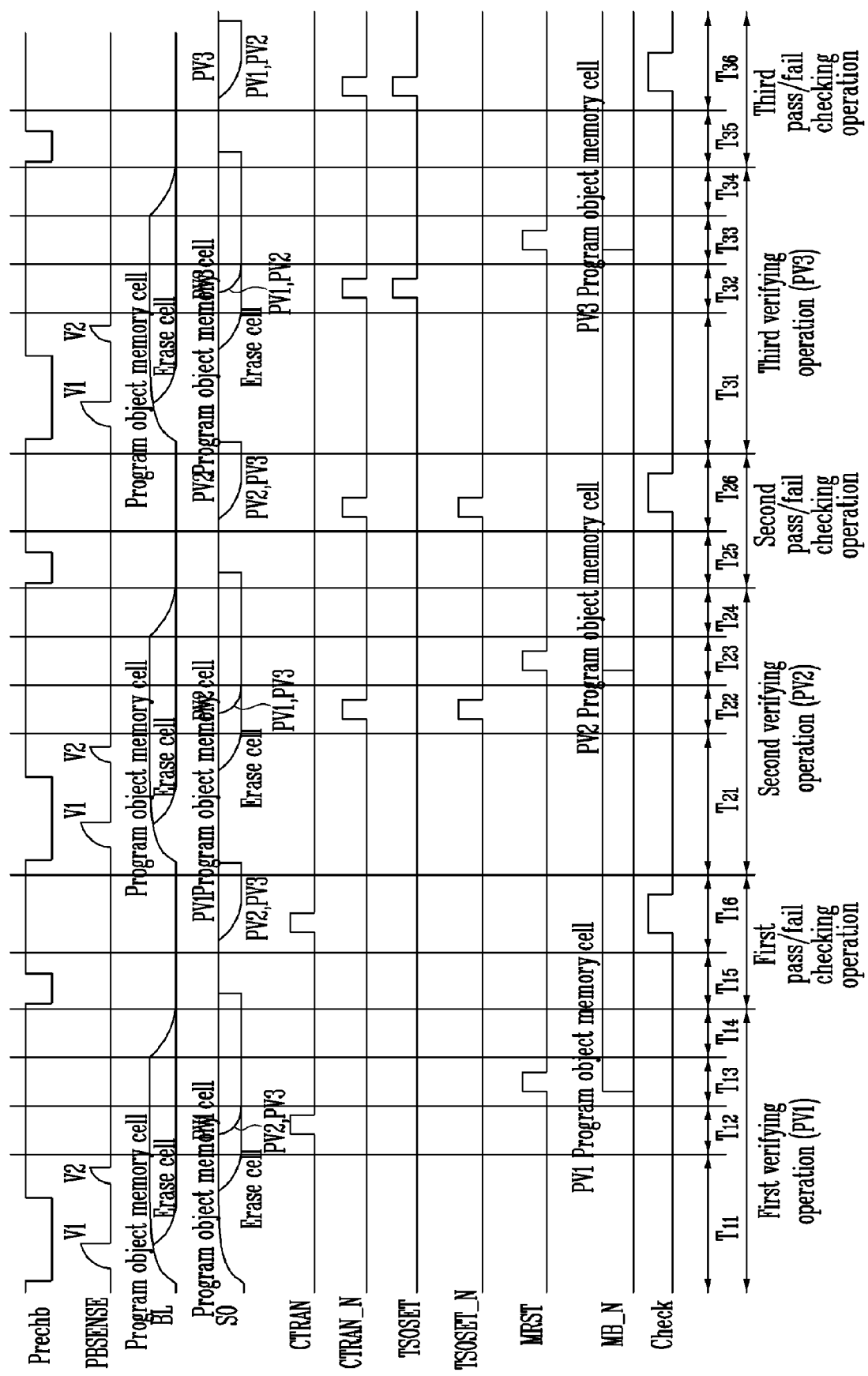
FIG. 5 is a view illustrating waveforms of signals transmitted in the program operation of the non-volatile memory device according to one exemplary embodiment of the present invention.

FIG. 5 is a view illustrating waveforms of signals transmitted in the program operation of the non-volatile memory device according to one exemplary embodiment of the present invention.

As shown in FIG. 5, the pass/fail checking operation is performed after the verifying operation is performed. Additionally, FIG. 5 shows a process of verifying the MSB program in the method of programming the MLC having 2 bits. Here, the program operation is not shown.

In intervals of T1 to T14, the first verifying operation is performed on the basis of the first verifying voltage PV1.

In the interval T11, the first verifying operation is performed by discriminating whether or not a current path is formed through a cell string having a verifying operation object memory cell under the condition that the first verifying voltage PV1 is applied to a word line corresponding to the memory cell and a pass voltage Vpass is provided to the other word lines. Particularly, a memory cell programmed to a voltage more than the first verifying voltage PV1 is turned off, and thus a current path is not formed. As a result, the sensing node SO maintains high level (precharge voltage). However, a memory cell programmed to a voltage less than the first verifying voltage PV1 is turned on, and so a current path is formed. As a result, the sensing node SO is discharged to low level.

In the interval T12, the sensing node SO is connected to a ground not to change data of the second register 230 in a page buffer for a second verifying operation object memory cell or a third verifying operation object memory cell before a data sensing operation, for storing data in accordance with level of the sensing node SO in a corresponding register, is performed.

The first verifying operation is performed in a unit of a page, and thus the first verifying operation is simultaneously performed about memory cells coupled to the same word line.

On the other hand, the second verifying operation object memory cell or the third verifying operation object memory cell as well as the first verifying operation object memory cell are included in one page. Accordingly, in case of performing the data sensing operation after the first verifying operation is performed, data, for indicating that the program operation is completed, may be stored in the second register 230 in FIG. 2 in accordance with a data sensing operation described below only because the second verifying operation object memory cell or the third verifying operation object memory cell is programmed to a voltage more than the first verifying voltage PV1. As a result, it may be misunderstood that the second verifying operation object memory cell or the third verifying operation object memory cell is programmed to a voltage more than the second verifying voltage PV2 or the third verifying voltage PV3. Accordingly, a problem exists in that a program pulse is not applied to a corresponding word line in following process.

To solve this problem, the program operation of the present invention couples the sensing node SO, coupled to the second verifying operation object memory cell or the third verifying operation object memory cell, to the ground. To the sensing node SO to the ground, the data stored in the first register 220 and the first data transmitting circuit 250 are used.

As mentioned above, data '0' is stored in the second node CB_N of the first register 220 for the second verifying operation object memory cell or the third verifying operation object memory cell. Hence, the sensing node SO may be coupled to the ground by transmitting the second data transmitting signal CTRAN having high level to the first data transmitting circuit 250.

That is, though the sensing node SO maintains high level because the second verifying operation object memory cell or the third verifying operation object memory cell is programmed to a voltage more than the first verifying voltage PV1 in the interval T11, the sensing node SO, for the second verifying operation object memory cell or the third verifying operation object memory cell, is changed into low level, i.e. is coupled to the ground. As a result, only the sensing node SO, coupled to memory cells programmed to a voltage more than the first verifying voltage PV1 among the first verifying operation object memory cells, maintains high level.

In the interval T13, the data sensing operation is performed in accordance with the level of the sensing node SO.

The second register 230 is used as a register of storing sensed data.

In case that the sensing node SO maintains high level, the sensing node sensing circuit 218 operates, and so a ground voltage is provided to the data setting circuit 236 of the second register 230. Here, in case that the first data setting signal MRST having high level is transmitted, data stored in the second node MB_N is converted from '0' into '1'.

As described above, though the second verifying operation object memory cell or the third verifying operation object memory cell is programmed to a voltage more than the first verifying voltage PV1, the sensing node SO, coupled to the second verifying operation object memory cell or the third verifying operation object memory cell, is coupled to the ground in the interval T12. Therefore, data of the second register 230 for the second verifying operation object memory cell or the third verifying operation object memory cell is not converted.

In the interval T14, voltage level of each bit lines is converted from high level into low level.

The first verifying operation is finished by the above process.

In intervals of T15 and T16, a pass/fail checking operation is performed so as to verify whether or not every first verifying operation object memory cell is programmed to a voltage more than the first verifying voltage PV1.

Particularly, the sensing node SO coupled to every memory cell is precharged to high level by providing the precharge signal Prechb having low level in the interval T15. In this case, the sensing node SO may maintain low level because some of the first verifying operation object memory cells are not programmed to a voltage more than the first verifying voltage PV1. This is for precharging the sensing node SO coupled to this memory cells to high level. This is because it is discriminated that the verifying operation is passed in the interval T16 in case that the sensing node SO maintains low level.

In the interval T16, it is verified through the pass/fail checking circuit 280 whether or not every verifying operation object memory cell is programmed to a voltage more than the first verifying voltage PV1.

Hereinafter, the present invention will be described in detail with reference to a pass/fail checking circuit.

Figure 6:
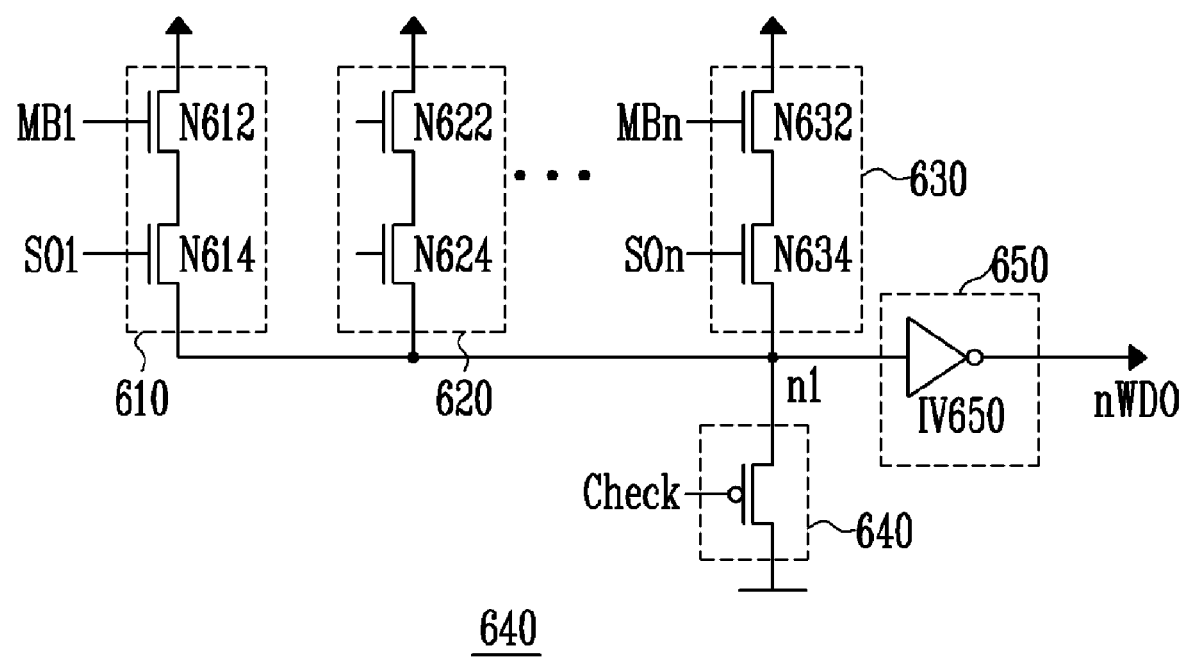
FIG. 6 is a view illustrating a pass/fail checking circuit of the non-volatile memory device according to one exemplary embodiment of the present invention.

FIG. 6 is a view illustrating a pass/fail checking circuit of the non-volatile memory device according to one exemplary embodiment of the present invention.

The pass/fail checking circuit 600 includes sub-pass/fail checking circuits 610, 620 and 630 of each page buffers coupled in parallel to a first node N1, a pull-up circuit 640 for pulling up the first node N1 in accordance with an inverse check signal /Check, and an outputting circuit 650 for outputting a verifying finish signal nWDO generated by inverting a signal of the first node N1.

Each of the sub-pass/fail checking circuits 610, 620 and 630 provides the ground voltage to the first node N1 in accordance with level of the first node MB of the second register 230 and the level of the sensing node SO.

In case that the inverse check signal /Check having low level is transmitted, the verifying operation is finished only when the sub-pass/fail checking circuits 610, 620 and 630 do not operate and maintain a floating state.

In other words, in case that one or more memory cell, for which the first node MB of the second register 230 and the sensing node SO have high level, exists, it is determined that the verifying operation is failed. As a result, the verifying operation is not completed.

Now referring to FIG. 5, to verify whether or not every first verifying operation object memory cell is programmed to a voltage more than the first verifying voltage PV1, the sensing node SO for the second verifying operation object memory cells or the third verifying operation object memory cells is coupled to the ground. Here, the coupling method is the same as in the interval T12. That is, the sensing node SO is coupled to the ground by using the data stored in the second node CB_N of the first register 220 and the second data transmitting signal CTRAN. Accordingly, the sub-pass/fail checking circuits coupled to the second or third verifying operation object memory cells have floating state. Hence, the pass/fail is determined by only state of the first verifying operation object memory cells.

Since the sensing node SO for the first verifying operation object memory cells is precharged to high level, the second N-MOS transistors N614, N624 and N634 in the sub-pass/fail checking circuits 610, 620 and 630 are turned on. In other words, the second N-MOS transistors N614, N624 and N634 are turned on irrespective of the fact as to whether or not the first verifying operation object memory cells are programmed to a voltage more than the first verifying voltage PV1. Accordingly, the pass/fail is determined by the data stored in the first node MB of the second register 230.

In case that the memory cell is programmed to a voltage more than the first verifying voltage PV1, data '0' is stored in the first node MB in the interval T13. However, in case that the memory cell is not programmed to a voltage more than the first verifying voltage PV1, the first node MB maintains data '1'.

Accordingly, every first N-MOS transistor N612, N622 and N632 of the sub-pass/fail checking circuits 610, 620 and 630 is turned off and the first node N1 maintains floating state only when every first verifying operation object memory cell is programmed to a voltage more than the first verifying voltage PV1.

In short, the sensing node SO for the second or third verifying operation object memory cells is coupled to the ground, and so every second N-MOS transistor N614, N624 and N634 is turned off. Subsequently, the sensing node SO for the first verifying operation object memory cells is precharged to high level, and thus the pass/fail is determined by only the data stored in the first node MB of the second register 230. In case that the first node N1 of the pass/fail checking circuit 600 has floating state by turning off the first N-MOS transistors N612, N622 and N632 or the second N-MOS transistors N614, N624 and N634 of the sub-pass/fail checking circuits 610, 620 and 630, it is determined that the first verifying operation is passed, i.e. completed.

In intervals of T21 to T24, the second verifying operation is performed on the basis of the second verifying voltage PV2.

The second verifying operation is similar to the first verifying operation.

In the second verifying operation, the second verifying voltage PV2 is applied to a word line coupled to memory cells to be verified, and the pass voltage Vpass is provided to the other word lines.

In the interval T22, the sensing node SO for memory cells except the second verifying operation object memory cells is coupled to the ground. This is because the data stored in the second register 230 may be changed in accordance with the data sensing operation in case that the memory cells not the second verifying operation object memory cells are programmed to a voltage more than the second verifying voltage PV2. To prevent this problem, the sensing node SO is coupled to the ground. To perform the above operation, the first data transmitting circuit 250 and the sensing node discharging circuit 270 are used.

Particularly, data '1' is stored in the second node CB_N of the first register 220 for the first verifying operation object memory cells (referring to FIG. 3). Hence, in case that the first data transmitting signal CTRAN_N having high level is transmitted to the first data transmitting circuit 250, the sensing node SO for the first verifying operation object memory cells may be coupled to the ground.

In addition, the sensing node SO for the third verifying operation object memory cells should be coupled to the ground. Data '1' is stored in the first node TB of the third register 240 for the third verifying operation object memory cells as shown in FIG. 3. Accordingly, the sensing node SO for the third verifying operation object memory cells may be coupled to the ground by transmitting the first sensing node discharge signal TSOSET_N to the sensing node discharging circuit 270.

In brief, the first verifying operation object memory cells or the third verifying operation object memory cells are coupled to the ground by providing the first data transmitting signal CTRAN_N and the first sensing node discharge signal TSOSET_N.

In the interval T23, the data sensing operation is performed in accordance with voltage level of the sensing node SO, and is similar to the interval T13.

On the other hand, the sensing node SO is coupled to the ground in the interval T22 though the first or third verifying operation object memory cells are programmed to a voltage more than the second verifying voltage PV2. Accordingly, the data stored in the second register 230 is not changed.

Subsequently, the voltage level of each bit lines is converted into low level in the interval T24.

The second verifying operation is finished by the above process.

In intervals of T25 and T26, a first pass/fail checking operation is performed so as to verify whether or not every second verifying operation object memory cell is programmed to a voltage more than the second verifying voltage PV2.

Particularly, the sensing node SO coupled to every memory cell is precharged to high level by providing the precharge signal Prechb having low level in the interval T25. This is similar to in the interval T15.

In the interval T26, it is verified through the pass/fail checking circuit 600 whether or not every second verifying operation object memory cell is programmed to a voltage more than the second verifying voltage PV2.

Particularly, the sensing node SO for the first or third verifying operation object memory cells is coupled to the ground so as to verify whether or not every second verifying operation object memory cell is programmed to a voltage more than the second verifying voltage PV2. The coupling method is the same as in the interval T22. Accordingly, the sub-pass/fail checking circuits 610, 620 and 630 coupled to the first or third verifying operation object memory cells have floating state. As a result, the pass/fail is determined by only state of the second verifying operation object memory cells.

Since the sensing node SO is precharged to high level, the N-MOS transistors N614, N624 and N634 of the sub-pass/fail checking circuits 610, 620 and 630 are turned on. In other words, the second N-MOS transistors N614, N624 and N634 are turned on irrespective of the fact as to whether or not the second verifying operation object memory cells are programmed to a voltage more than the second verifying voltage PV2. Accordingly, the pass/fail is determined by the data stored in the first node MB of the second register 230.

In case that the memory cell is programmed to a voltage more than the second verifying voltage PV2, data '0' is stored in the first node MB in the interval T23. However, in case that the memory cell is not programmed to a voltage more than the second verifying voltage PV2, the first node MB maintains data '1'.

Accordingly, every first N-MOS transistor N612, N622 and N632 of the sub-pass/fail checking circuits 610, 620 and 630 is turned off and the first node N1 maintains floating state only when every second verifying operation object memory cell is programmed to a voltage more than the second verifying voltage PV2.

In brief, the sensing node SO for the first or third verifying operation object memory cells is coupled to the ground, and so every second N-MOS transistor N614, N624 and N634 is turned off. Subsequently, the sensing node SO for the second verifying operation object memory cells is precharged to high level, and thus the pass/fail is determined by only the data stored in the first node MB of the second register 230. In case that the first node N1 of the pass/fail checking circuit 600 has floating state by turning off the first N-MOS transistors N612, N622 and N632 or the second N-MOS transistors N614, N624 and N634 of the sub-pass/fail checking circuits 610, 620 and 630, it is determined that the second verifying operation is passed, i.e. completed.

In intervals of T31 to T34, the third verifying operation is performed on the basis of the third verifying voltage PV3.

The third verifying operation is similar to the first verifying operation and the second verifying operation.

In the third verifying operation, the third verifying voltage PV3 is applied to a word line coupled to memory cells to be verified, and the pass voltage Vpass is provided to the other word lines.

In the interval T32, the sensing node SO coupled to memory cells except the third verifying operation object memory cells is coupled to the ground. This is because the data stored in the second register 230 may be changed in accordance with the data sensing operation in case that the memory cells not the third verifying operation object memory cells are programmed to a voltage more than the third verifying voltage PV3. To prevent this problem, the sensing node SO is coupled to the ground.

To perform the above operation, the first data transmitting circuit 250 and the sensing node discharging circuit 270 are used.

Particularly, data '1' is stored in the second node CB_N of the first register 220 for the first verifying operation object memory cells (referring to FIG. 3). Hence, in case that the first data transmitting signal CTRAN_N having high level is transmitted to the first data transmitting circuit 250, the sensing node SO coupled to the first verifying operation object memory cells may be coupled to the ground.

In addition, the second verifying operation object memory cells should be coupled to the ground. Data '1' is stored in the second node TB_N of the third register 240 for the second verifying operation object memory cells as shown in FIG. 3. Accordingly, the sensing node SO for the second verifying operation object memory cells may be coupled to the ground by transmitting the second sensing node discharge signal TSOSET to the sensing node discharging circuit 270.

In short, the first verifying operation object memory cells or the second verifying operation object memory cells are coupled to the ground by providing the first data transmitting signal CTRAN_N and the second sensing node discharge signal TSOSET.

In the interval T33, the data sensing operation is performed in accordance with voltage level of the sensing node SO, and is similar to the intervals T13 and T23.

On the other hand, the sensing node SO is coupled to the ground in the interval T32 though the first or second verifying operation object memory cells are programmed to a voltage more than the third verifying voltage PV3. Accordingly, the data stored in the second register 230 is not converted.

Subsequently, the voltage level of each bit lines is converted into low level in the interval T34.

The third verifying operation is finished by the above process.

In intervals of T35 and T36, a first pass/fail checking operation is performed so as to verify whether or not every third verifying operation object memory cell is programmed to a voltage more than the third verifying voltage PV3.

Particularly, the sensing node SO coupled to every memory cell is precharged to high level by providing the precharge signal Prechb having low level in the interval T35. This is similar to in the intervals T15 and T25.

In the interval T36, it is verified through the pass/fail checking circuit 600 whether or not every third verifying operation object memory cell is programmed to a voltage more than the third verifying voltage PV3.

To verify whether or not every third verifying operation object memory cell is programmed to a voltage more than the third verifying voltage PV3, the sensing node SO for the first or second verifying operation object memory cells is coupled to the ground. The coupling method is the same as in the interval T32. Accordingly, the sub-pass/fail checking circuits coupled to the first or second verifying operation object memory cells have floating state. As a result, the pass/fail is determined by only state of the third verifying operation object memory cells.

Since the sensing node SO is precharged to high level, the second N-MOS transistors N614, N624 and N634 of the sub-pass/fail checking circuits 610, 620 and 630 are turned on. In other words, the second N-MOS transistors N614, N624 and N634 are turned on irrespective of the fact as to whether or not the third verifying operation object memory cells are programmed to a voltage more than the third verifying voltage PV3. Accordingly, the pass/fail is determined by the data stored in the first node MB of the second register 230.

In case that the memory cell is programmed to a voltage more than the third verifying voltage PV3, data '0' is stored in the first node MB in the interval T33. However, in case that the memory cell is not programmed to a voltage more than the third verifying voltage PV3, the first node MB maintains data '1'.

Accordingly, every first N-MOS transistor N612, N622 and N632 of the sub-pass/fail checking circuits 610, 620 and 630 is turned off and the first node N1 maintains floating state only when every third verifying operation object memory cell is programmed to a voltage more than the third verifying voltage PV3.

In short, the sensing node SO for the first or second verifying operation object memory cells is coupled to the ground, and so every second N-MOS transistor N614, N624 and N634 is turned off. Subsequently, the sensing node SO for the third verifying operation object memory cells is precharged to high level, and thus the pass/fail is determined by only the data stored in the first node MB of the second register 230. In case that the first node N1 of the pass/fail checking circuit 600 has floating state by turning off the first N-MOS transistors N612, N622 and N632 or the second N-MOS transistors N614, N624 and N634 of the sub-pass/fail checking circuits 610, 620 and 630, it is determined that the third verifying operation is passed, i.e. completed.

Figure 7:
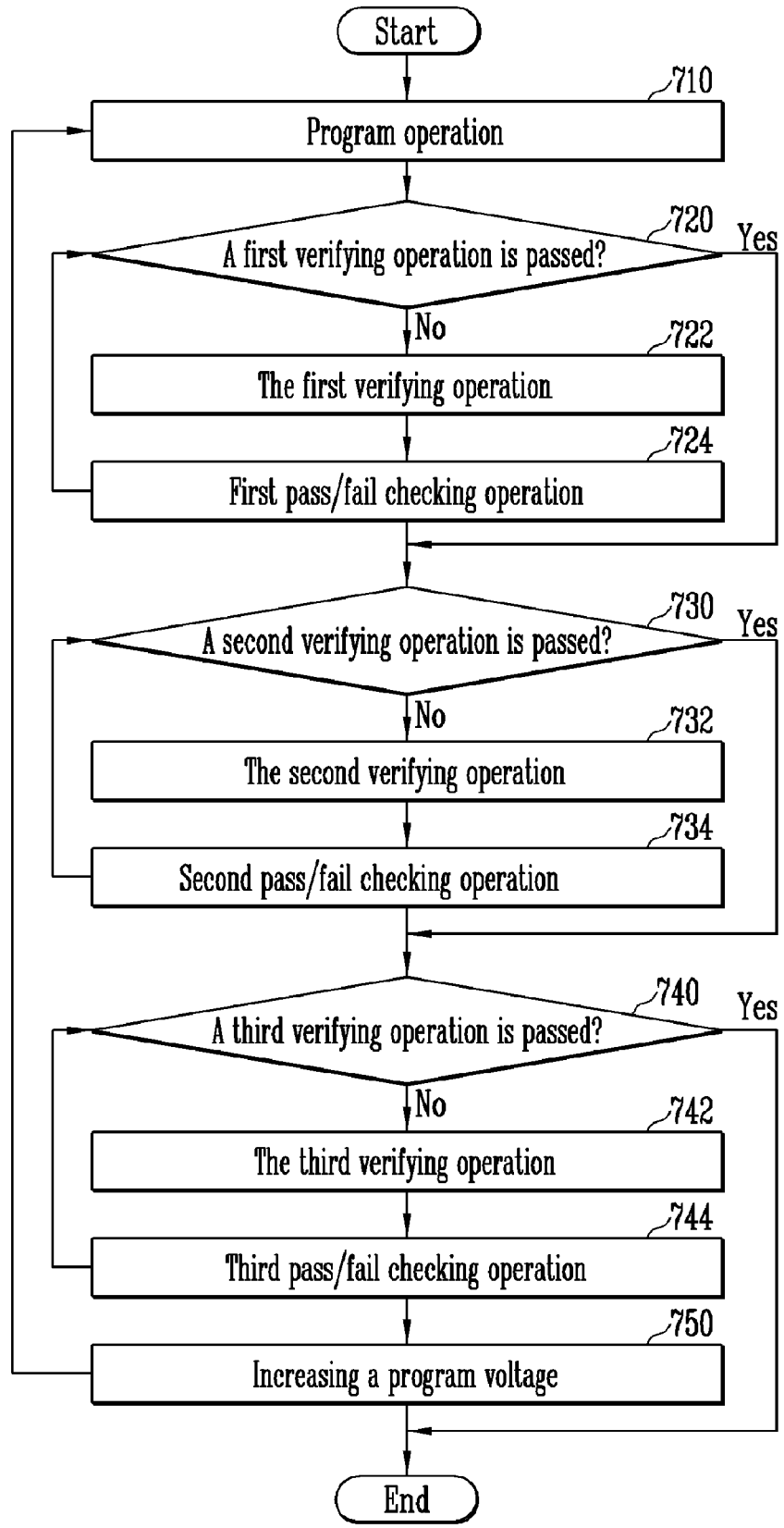
FIG. 7 is a flow chart illustrating a method of verifying a program operation in a non-volatile memory device according to one exemplary embodiment of the present invention.

FIG. 7 is a flow chart illustrating a method of verifying a program operation in a non-volatile memory device according to one exemplary embodiment of the present invention.

FIG. 7 shows the operation in FIG. 4 and FIG. 5.

In step S710, a program operation is performed by applying a program voltage to corresponding word line.

In step S720, it is determined whether or not a first verifying operation is performed. Here, the determination is performed with reference to a result of the first pass/fail checking operation. That is, in case that it is discriminated that the first verifying operation is passed through a result of a first pass/fail checking operation (in step S724) performed in a program operation prior to the program operation, the first verifying operation is no more performed. It is discriminated whether or not the second verifying operation is performed.

However, when initial program operation is performed, the first verifying operation is performed because the first pass/fail checking operation is not performed in step S722. In addition, the first verifying operation is performed though memory cells not passed exists in accordance with the result of the first pass/fail checking operation.

In step S724, the first pass/fail checking operation is performed after the first verifying operation is performed.

The result of the first pass/fail checking operation is stored in a specific register in a controller of the non-volatile memory device. In case that it is discriminated that the program operation is passed through the first verifying operation, the step S720 controls not to perform the first verifying operation after following program operation is performed.

In step S730, it is determined whether or not a second verifying operation is performed. Here, the determination is performed with reference to a result of the second pass/fail checking operation. In other words, in case that it is discriminated that the second verifying operation is passed through a result of a second pass/fail checking operation (in step S734) performed in a program operation prior to the program operation, the second verifying operation is not performed. It is discriminated whether or not a third verifying operation is performed.

However, when initial program operation is performed, the second verifying operation is performed because the second pass/fail checking operation is not performed in step S732. In addition, the second verifying operation is performed though memory cells not passed exist in accordance with the result of the second pass/fail checking operation.

In step S734, the second pass/fail checking operation is performed after the second verifying operation is performed.

The result of the second pass/fail checking operation is stored in a given register in the controller of the non-volatile memory device. In case that it is discriminated that the program operation is passed through the second verifying operation, the step S730 controls not to perform the second verifying operation after following program operation is performed.

In step S740, it is determined whether or not a third verifying operation is performed. Here, the determination is performed with reference to a result of a third pass/fail checking operation. That is, in case that it is discriminated that the third verifying operation is passed through a result of a third pass/fail checking operation (in step S744) performed in a program operation prior to the program operation, the second verifying operation is not performed. The program operation is finished. Generally, since a third verifying voltage has highest level and much time is required for programming to a voltage more than the third verifying voltage, the MSB program operation is completed when the program operation is passed in accordance with the third verifying operation. In another exemplary embodiment of the present invention, the program operation may be completed in case that the program operation is passed through the first to third pass/fail checking operations. This is because it is not discriminated how verifying operation is first finished due to characteristics of the MSB program operation.

When initial program operation is performed, the third verifying operation is performed because the third pass/fail checking operation is not performed in step S742. In addition, the third verifying operation is performed though memory cells not passed exist in accordance with the result of the third pass/fail checking operation.

In step S744, the third pass/fail checking operation is performed after the third verifying operation is performed.

The result of the third pass/fail checking operation is stored in a given register in the controller of the non-volatile memory device. In case that it is discriminated that the program operation is passed through the third verifying operation, the step S740 controls not to perform the third verifying operation after following program operation is performed.

In step S750, in case that it is discriminated that the program operation is not passed through the third verifying operation, the program voltage is increased, and then the program operation is repeatedly performed. That is, the program voltage is increased by a step voltage in accordance with an ISPP method, and then the program operation is repeatedly performed.

As described above, in one exemplary embodiment of the present invention, the pass/fail checking operations are respectively performed for the verifying operations. As a result, it is verified whether or not each of the verifying operations is completed. Accordingly, in case that a specific verifying operation is completed, the verifying operation is not performed any more. For example, in case that it is verified through the first pass/fail checking operation that every first verifying operation object memory cell is programmed, the first verifying operation is not performed after next program operation is performed.

Hereinafter, another verifying operation of the non-volatile memory device will be described in detail.

Figure 8:
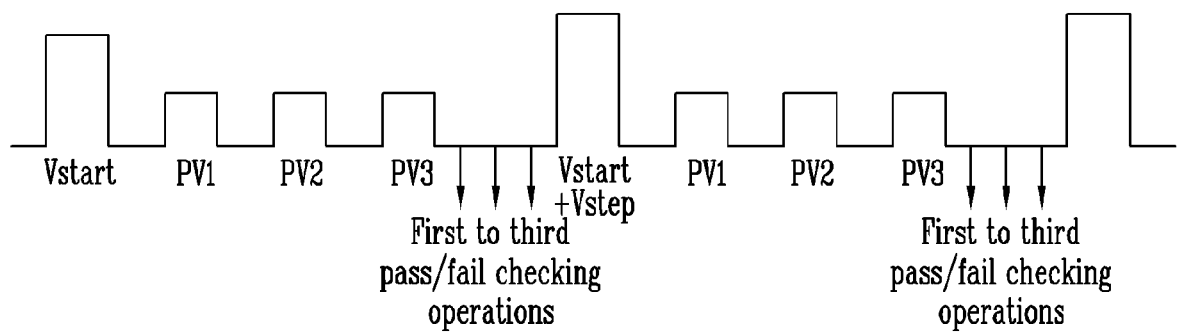
FIG. 8 is a view illustrating a method of verifying a program operation in a non-volatile memory device according to another exemplary embodiment of the present invention.

FIG. 8 is a view illustrating a method of verifying a program operation in a non-volatile memory device according to another exemplary embodiment of the present invention.

FIG. 8 shows an MSB program operation of a multi level cell MLC program operation for 2 bits.

The program operation is performed in accordance with an ISPP method. To perform the program operation, a program pulse is provided, and then a first verifying operation based on a first verifying voltage PV1, a second verifying operation based on a second verifying voltage PV2 and a third verifying operation based on a third verifying voltage PV3 are performed in sequence.

The above verifying operations are performed, and then a pass/fail checking operation is performed. That is, unlike the embodiment in FIG. 4, the first to third pass/fail checking operations are performed after every verifying operation is finished.

Since the first verifying operation object memory cells, the second verifying operation object memory cells and the third verifying operation object memory cells are divided in accordance with the data in the first register 220 and the data in the third register 240, effect when the pass/fail checking operations are performed after the verifying operations are finished may be identical to that in FIG. 4.

Figure 9:
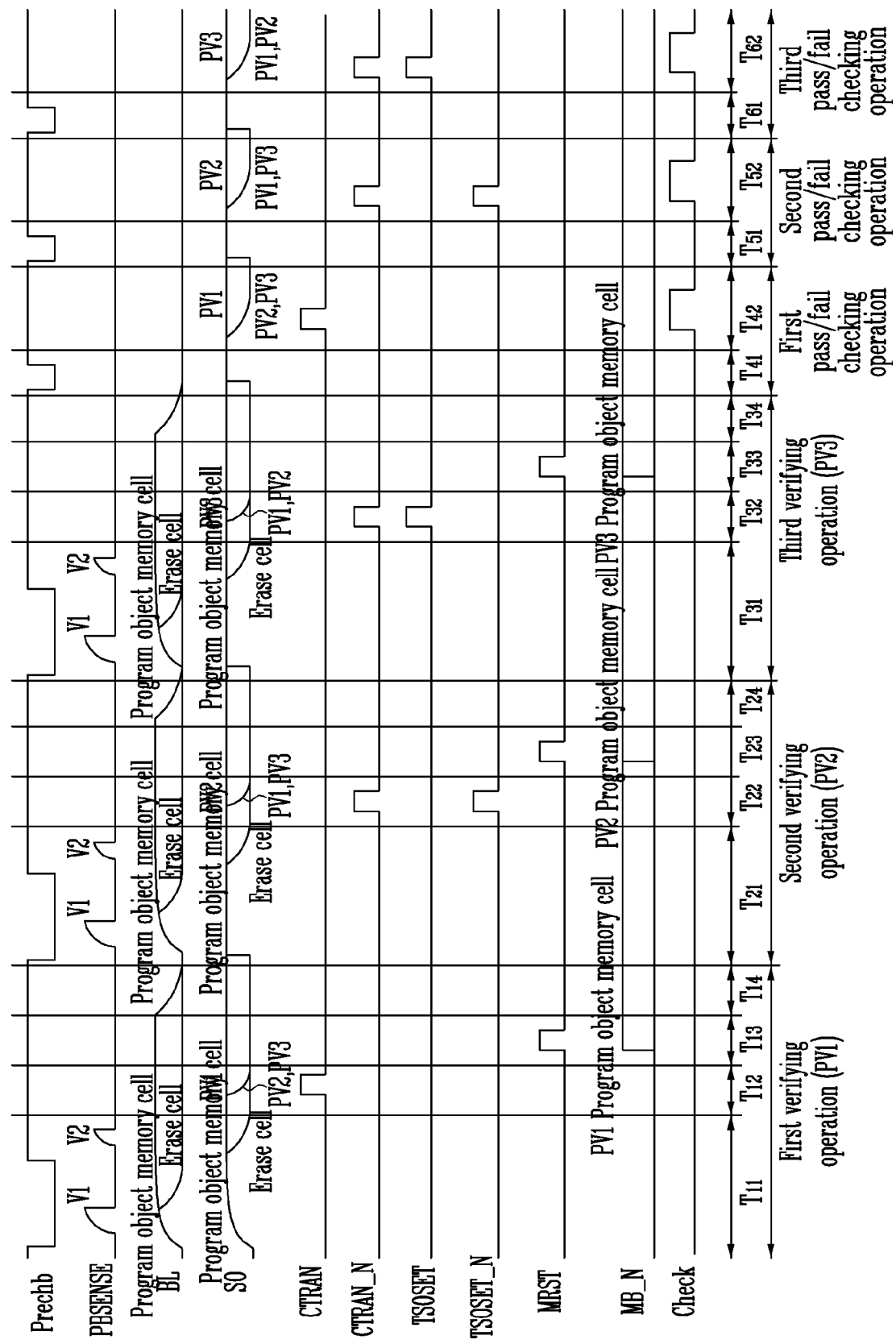
FIG. 9 is a view illustrating waveform of signals provided for a verifying operation of a non-volatile memory device according to still another exemplary embodiment of the present invention.

FIG. 9 is a view illustrating waveform of signals provided for a verifying operation of a non-volatile memory device according to still another exemplary embodiment of the present invention.

As shown in FIG. 9, the pass/fail checking operations are performed after every verifying operation is performed. In addition, FIG. 9 shows a verifying operation for verifying an MSB program operation of an MLC program operation for 2 bits, but does not show the program operation.

In intervals of T11 to T14, the first verifying operation is performed on the basis of the first verifying voltage PV1. The first verifying operation is performed by discriminating whether or not a current path is formed through a cell string having a memory cell to be verified under the condition that the first verifying voltage PV1 is applied to a word line corresponding to the memory cell to be verified and a pass voltage Vpass is provided to the other word lines. Here, since the first verifying operation is the same as in FIG. 5, any further description concerning the first verifying operation will be omitted.

In intervals of T21 to T24, T31 to T34, the second verifying operation and the third verifying operation are performed in sequence on the basis of the second verifying voltage PV2 and the third verifying voltage PV3. Here, the first to third verifying operations are similar in FIG. 5.

In intervals of T41 and T42, T51 and T52, T61 and T62, the first to third pass/fail checking operations are performed in sequence after the third verifying operation is finished. Here, the first to third pass/fail checking operations are similar in FIG. 5.

In the first pass/fail checking operation, the precharge signal Prechb having low level is provided, and so the sensing node SO coupled to every memory cell is precharged to high level in the interval T41. Particularly, in case that some of the first verifying operation object memory cells are not programmed to a voltage more than the first verifying voltage PV1, the sensing node SO may maintain low level. As a result, it may be discriminated that the first verifying operation is passed in the interval T42. Accordingly, the sensing node SO is precharged to high level through the above method.

In the interval T42, it is discriminated through the pass/fail checking circuit 280 whether or not every first verifying operation object memory cell is programmed to a voltage more than the first verifying voltage PV1. Here, the sensing node SO for the second verifying operation object memory cells or the third verifying operation object memory cells is coupled to a ground. This process is the same as in the interval T12. In other words, the sensing node SO is coupled to the ground by using the data stored in the second node CB_N of the first register 220 and the second data transmitting signal CTRAN. Accordingly, the sub-pass/fail checking circuits coupled to the second or third verifying operation object memory cells have floating state. Hence, the pass/fail is determined by only state of the first verifying operation object memory cells.

Since the sensing node SO is precharged to high level, the second N-MOS transistors N614, N624 and N634 of the sub-pass/fail checking circuits 610, 620 and 630 are turned on. That is, the second N-MOS transistors N614, N624 and N634 are turned on irrespective of the fact as to whether or not the first verifying operation object memory cells are programmed to a voltage more than the first verifying voltage PV1. Accordingly, the pass/fail is determined by the data stored in the first node MB of the second register 230.

In case that the memory cell is programmed to a voltage more than the first verifying voltage PV1, data '0' is stored in the first node MB in the interval T13. However, in case that the memory cell is not programmed to a voltage more than the first verifying voltage PV1, the first node MB maintains data '1'.

Accordingly, every first N-MOS transistor N612, N622 and N632 of the sub-pass/fail checking circuits 610, 620 and 630 is turned off and the first node N1 maintains floating state only when every first verifying operation object memory cell is programmed to a voltage more than the first verifying voltage PV1.

In short, the sensing node SO related to the second or third verifying operation object memory cells is coupled to the ground, and so every second N-MOS transistor N614, N624 and N634 is turned off. Subsequently, the sensing node SO for the first verifying operation object memory cells is precharged to high level, and thus the pass/fail is determined by only the data stored in the first node MB of the second register 230.

In case that the first node N1 of the pass/fail checking circuit 600 has floating state by turning off the first N-MOS transistors N612, N622 and N632 or the second N-MOS transistors N614, N624 and N634 of the sub-pass/fail checking circuits 610, 620 and 630, it is discriminated that the first verifying operation is passed, i.e. completed.

In the intervals T51 and T52, the second pass/fail checking operation is performed. Particularly, the precharge signal Prechb having low level is provided, and so the sensing node SO coupled to every memory cell is precharged to high level in the interval T51. This is the same as in the interval T41.

In the interval T52, it is discriminated through the pass/fail checking circuit 280 whether or not every second verifying operation object memory cell is programmed to a voltage more than the second verifying voltage PV2. Here, the sensing node SO for the first verifying operation object memory cells or the third verifying operation object memory cells is coupled to the ground. This process is the same as in the interval T22. Accordingly, the sub-pass/fail checking circuits coupled to the first or third verifying operation object memory cells have floating state. Hence, the pass/fail is determined by only state of the second verifying operation object memory cells.

Since the sensing node SO is precharged to high level, the second N-MOS transistors N614, N624 and N634 of the sub-pass/fail checking circuits 610, 620 and 630 are turned on. That is, the second N-MOS transistors N614, N624 and N634 are turned on irrespective of the fact as to whether or not the second verifying operation object memory cells are programmed to a voltage more than the second verifying voltage PV2. Accordingly, the pass/fail is determined by the data stored in the first node MB of the second register 230.

In case that the memory cell is programmed to a voltage more than the second verifying voltage PV2, data '0' is stored in the first node MB in the interval T23. However, in case that the memory cell is not programmed to a voltage more than the second verifying voltage PV2, the first node MB maintains data '1'.

Accordingly, every first N-MOS transistor N612, N622 and N632 of the sub-pass/fail checking circuits 610, 620 and 630 is turned off and the first node N1 maintains floating state only when every second verifying operation object memory cell is programmed to a voltage more than the second verifying voltage PV2.

In short, the sensing node SO for the first or third verifying operation object memory cells is coupled to the ground, and so every second N-MOS transistor N614, N624 and N634 is turned off. Subsequently, the sensing node SO for the second verifying operation object memory cells is precharged to high level, and thus the pass/fail is determined by only the data stored in the first node MB of the second register 230.

In case that so the first node N1 of the pass/fail checking circuit 600 has floating state by turning off the first N-MOS transistors N612, N622 and N632 or the second N-MOS transistors N614, N624 and N634 of the sub-pass/fail checking circuits 610, 620 and 630, it is discriminated that the second verifying operation is passed, i.e. completed.

In the intervals T61 and T62, the third pass/fail checking operation is performed. Particularly, the precharge signal Prechb having low level is provided, and so the sensing node SO coupled to every memory cell is precharged to high level in the interval T61. This is the same as in the intervals T41 and T51.

In the interval T62, it is discriminated through the pass/fail checking circuit 280 whether or not every third verifying operation object memory cell is programmed to a voltage more than the third verifying voltage PV3. Here, the sensing node SO for the first verifying operation object memory cells or the second verifying operation object memory cells is coupled to the ground. This process is the same as in the interval T32. Accordingly, the sub-pass/fail checking circuits coupled to the first or second verifying operation object memory cells have floating state. Hence, the pass/fail is determined by only state of the third verifying operation object memory cells.

Since the sensing node SO is precharged to high level, the second N-MOS transistors N614, N624 and N634 of the sub-pass/fail checking circuits 610, 620 and 630 are turned on. That is, the second N-MOS transistors N614, N624 and N634 are turned on irrespective of the fact as to whether or not the third verifying operation object memory cells are programmed to a voltage more than the third verifying voltage PV3. Accordingly, the pass/fail is determined by the data stored in the first node MB of the second register 230.

In case that the memory cell is programmed to a voltage more than the third verifying voltage PV3, data '0' is stored in the first node MB in the interval T33. However, in case that the memory cell is not programmed to a voltage more than the third verifying voltage PV3, the first node MB maintains data '1'.

Accordingly, every first N-MOS transistor N612, N622 and N632 of the sub-pass/fail checking circuits 610, 620 and 630 is turned off and the first node N1 maintains floating state only when every third verifying operation object memory cell is programmed to a voltage more than the third verifying voltage PV3.

In brief, the sensing node SO for the first or second verifying operation object memory cells is coupled to the ground, and so every second N-MOS transistor N614, N624 and N634 is turned off. Subsequently, the sensing node SO for the third verifying operation object memory cells is precharged to high level, and thus the pass/fail is determined by only the data stored in the first node MB of the second register 230.

In case that the first node N1 of the pass/fail checking circuit 600 has floating state by turning off the first N-MOS transistors N612, N622 and N632 or the second N-MOS transistors N614, N624 and N634 of the sub-pass/fail checking circuits 610, 620 and 630, it is discriminated that the third verifying operation is passed, i.e. completed.

Figure 10:
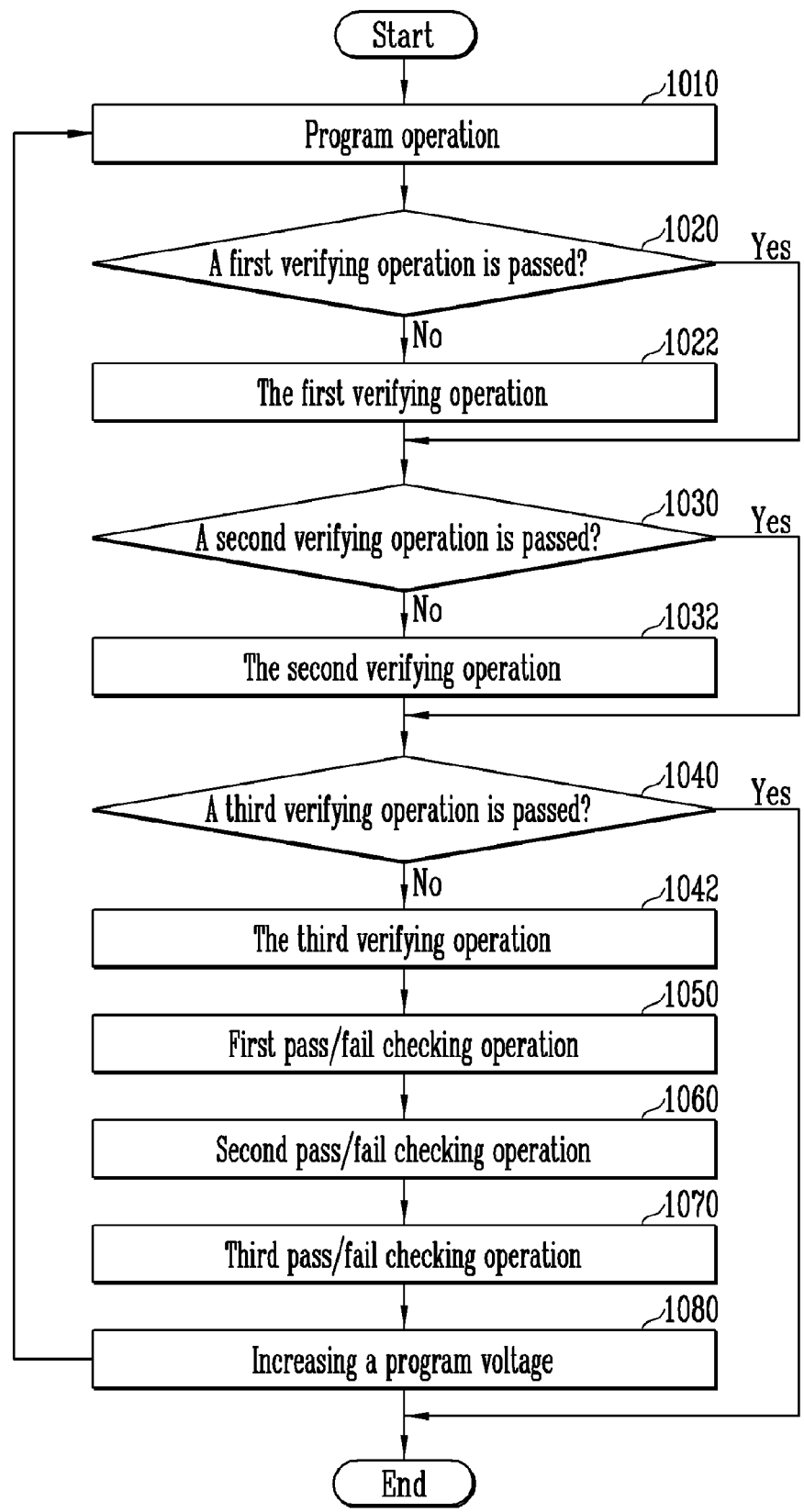
FIG. 10 is a flowchart illustrating a process of verifying a program operation in a non-volatile memory device according to still another exemplary embodiment of the present invention.

FIG. 10 is a flowchart illustrating a process of verifying a program operation in a non-volatile memory device according to still another exemplary embodiment of the present invention.

The process in FIG. 10 abstracts the operations in FIG. 8 and FIG. 9.

In step S100, a program operation is performed by applying a program voltage to a corresponding word line.

In step S1020, it is determined whether or not a first verifying operation is to be performed.

The determination is performed with reference to result in accordance with the first pass/fail checking operation. This is, in case that it is discriminated that the first verifying operation is passed in accordance with the result of the first pass/fail checking operation (the step S1050) performed in a program operation just prior to the program operation, it is discriminated whether or not the second verifying operation is performed. Here, the first verifying operation is not performed.

However, since the first pass/fail checking operation is not performed in a first program operation, the first verifying operation is performed in step S1022. In addition, the first verifying operation is performed in case that memory cells not passed exist in accordance with result of the first pass/fail checking operation.

In step S1030, it is determined whether or not the second verifying operation is performed.

The determination is performed with reference to result in accordance with a second pass/fail checking operation. This is, in case that it is discriminated that the second verifying operation is passed in accordance with the result of the second pass/fail checking operation (the step S1060) performed in a program operation just prior to the program operation, it is discriminated whether or not a third verifying operation is performed. Here, the second verifying operation is not performed.

However, since the second pass/fail checking operation is not performed in a first program operation, the second verifying operation is performed in step S1032. Additionally, the second verifying operation is performed in case that memory cells not passed exist in accordance with result of the second pass/fail checking operation.

In step S1040, it is determined whether or not the third verifying operation is performed.

The determination is performed with reference to result in accordance with a third pass/fail checking operation. This is, in case that it is discriminated that the third verifying operation is passed in accordance with the result of the third pass/fail checking operation (the step S1070) performed in a program operation just prior to the program operation, the program operation is finished. Here, the third verifying operation is not performed.

Generally, since the third verifying voltage PV3 has highest value and much time is required for programming to a voltage more than the third verifying voltage PV3, the MSB program operation is finished in case that the program operation is passed in accordance with the third verifying operation. In another exemplary embodiment of the present invention, in case that it is discriminated that the program operation is passed in accordance with result of the first to third pass/fail checking operations, the program operation may be finished. This is because it is not discriminated how verifying operation is first finished due to characteristics of the MSB program operation, and so the above algorithm may be performed.

Since the third pass/fail checking operation is not performed in a first program operation, the third verifying operation is performed in step S1042. Additionally, the third verifying operation is performed in case that memory cells not passed exist in accordance with result of the third pass/fail checking operation.

In step S1050, the first pass/fail checking operation is performed after the first to third verifying operations are performed. Here, result of the first pass/fail checking operation is stored in a given register included in the controller of the non-volatile memory device. In case that it is discriminated that a corresponding program operation is passed in accordance with the first verifying operation, following program operation is performed, and then the first verifying operation is not performed in the step S1020.

In step S1060, the second pass/fail checking operation is performed. Here, result of the second pass/fail checking operation is stored in a specific register included in the controller of the non-volatile memory device. In case that it is discriminated that a corresponding program operation is passed in accordance with the second verifying operation, following program operation is performed, and then the second verifying operation is not performed in the step S1030.

In step S1070, the third pass/fail checking operation is performed after the third verifying operation is performed. Here, result of the third pass/fail checking operation is stored in a given register included in the controller of the non-volatile memory device. In case that it is discriminated that a corresponding program operation is passed in accordance with the third verifying operation, following program operation is performed, and then the third verifying operation is not performed in the step S1040.

In step S1080, in case that it is discriminated that a corresponding program operation is not passed in accordance with result of the third verifying operation, the program voltage is increased, and then the program operation is repeatedly performed. In other words, the program voltage is increased by a step voltage in accordance with the ISPP method, and then the program operation is repeatedly performed.

As described above, every verifying operation is performed, and then the pass/fail checking operations for the verifying operations are performed. As a result, it is independently discriminated whether or not each of the verifying operations is finished.

Accordingly, it is verified whether or not a specific verifying operation is completed, and then a corresponding verifying operation may not be performed. For example, in case that it is verified that every first verifying operation object memory cell is programmed in accordance with the result of the first pass/fail checking operation, the first verifying operation is not performed after next program operation is performed.

In brief, when a specific verifying operation is performed, a verifying operation for memory cells not verified is not performed by coupling the sensing node SO for the memory cells not verified to the ground. Here, the memory cells not verified are blocked by using the data stored in the first register 220 and the third register 240.

In the pass/fail checking operations, the sensing node SO coupled to memory cells not verified is coupled to the ground, and so corresponding memory cells are set as pass state. In addition, the memory cells not verified are set as pass state by using the data stored in the first register 220 and the third register 240.

Figure 11:
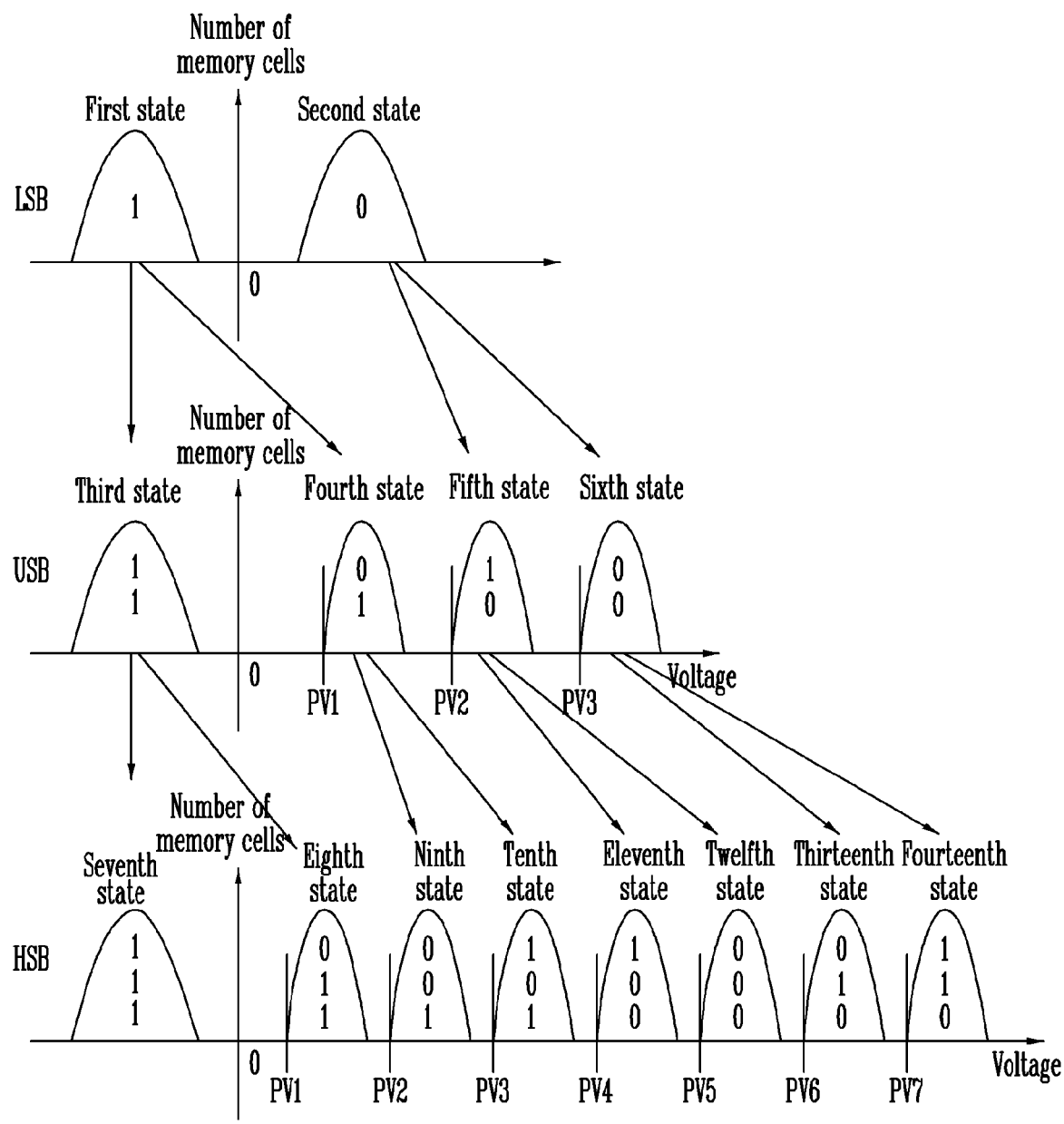
FIG. 11 is a view illustrating a method of programming an MLC in the non-volatile memory device according to one exemplary embodiment of the present invention.

FIG. 11 is a view illustrating a method of programming an MLC in the non-volatile memory device according to one exemplary embodiment of the present invention.

FIG. 11 shows the method of programming the MLC having 3 bits.

The MLC has two different distribution states '1' and '0' in accordance with a first bit program operation LSB. In this case, a common program operation/a verifying operation are performed in accordance with a method of programming a single level cell.

Subsequently, the MLC has four different distribution states '11', '01', '10' and '00' in accordance with a second bit program operation USB.

Then, the MLC has eight different distribution states '111', '011', '001', '101', '100', '000', '010' and '110' in accordance with a third bit program operation HSB.

On the other hand, eight different distribution states are formed by applying one time a program pulse in the third bit program operation HSB. Then, verifying operations are performed about each of the distribution states except a seventh distribution state which does not correspond to program object. Here, since memory cells to be programmed to the seventh distribution state to a fourteenth distribution state exist in one HSB page, the verifying operations should be separately performed in accordance with the distribution states. In other words, a first verifying operation is performed about memory cells to be programmed to the eight distribution state on the basis of a first verifying voltage PV1, and a second verifying operation is performed about memory cells to be programmed to a ninth distribution state on the basis of a second verifying voltage PV2. In addition, a third verifying operation is performed about memory cells to be programmed to the tenth distribution state on the basis of a third verifying voltage PV3, and a fourth verifying operation is performed about memory cells to be programmed to an eleventh distribution state on the basis of a fourth verifying voltage PV4. Moreover, a fifth verifying operation is performed about memory cells to be programmed to the twelfth distribution state on the basis of a fifth verifying voltage PV5, and a sixth verifying operation is performed about memory cells to be programmed to a thirteenth distribution state on the basis of a sixth verifying voltage PV6. Additionally, a seventh verifying operation is performed about memory cells to be programmed to a fourteenth distribution state on the basis of a seventh verifying voltage PV7.

Hereinafter, the memory cells to be programmed to the eight distribution state are assumed as first verifying operation object memory cells, the memory cells to be programmed to the ninth distribution state are assumed as second verifying operation object memory cells, the memory cells to be programmed to the tenth distribution state are assumed as third verifying operation object memory cells. In addition, the memory cells to be programmed to the eleventh distribution state are assumed as fourth verifying operation object memory cells, the memory cells to be programmed to the twelfth distribution state are assumed as fifth verifying operation object memory cells, the memory cells to be programmed to the thirteenth distribution state are assumed as sixth verifying operation object memory cells, and the memory cells to be programmed to the fourteenth distribution state are assumed as seventh verifying operation object memory cells.

On the other hand, it is verified through pass/fail checking operations whether or not the verifying operations are finished. That is, in case that every memory cell to be programmed to a specific distribution state is programmed to a voltage more than a corresponding verifying voltage, a pass signal is outputted so that a corresponding verifying operation is not again performed. Accordingly, the completed verifying operation is not performed whenever the program operations are performed.

Figure 12:
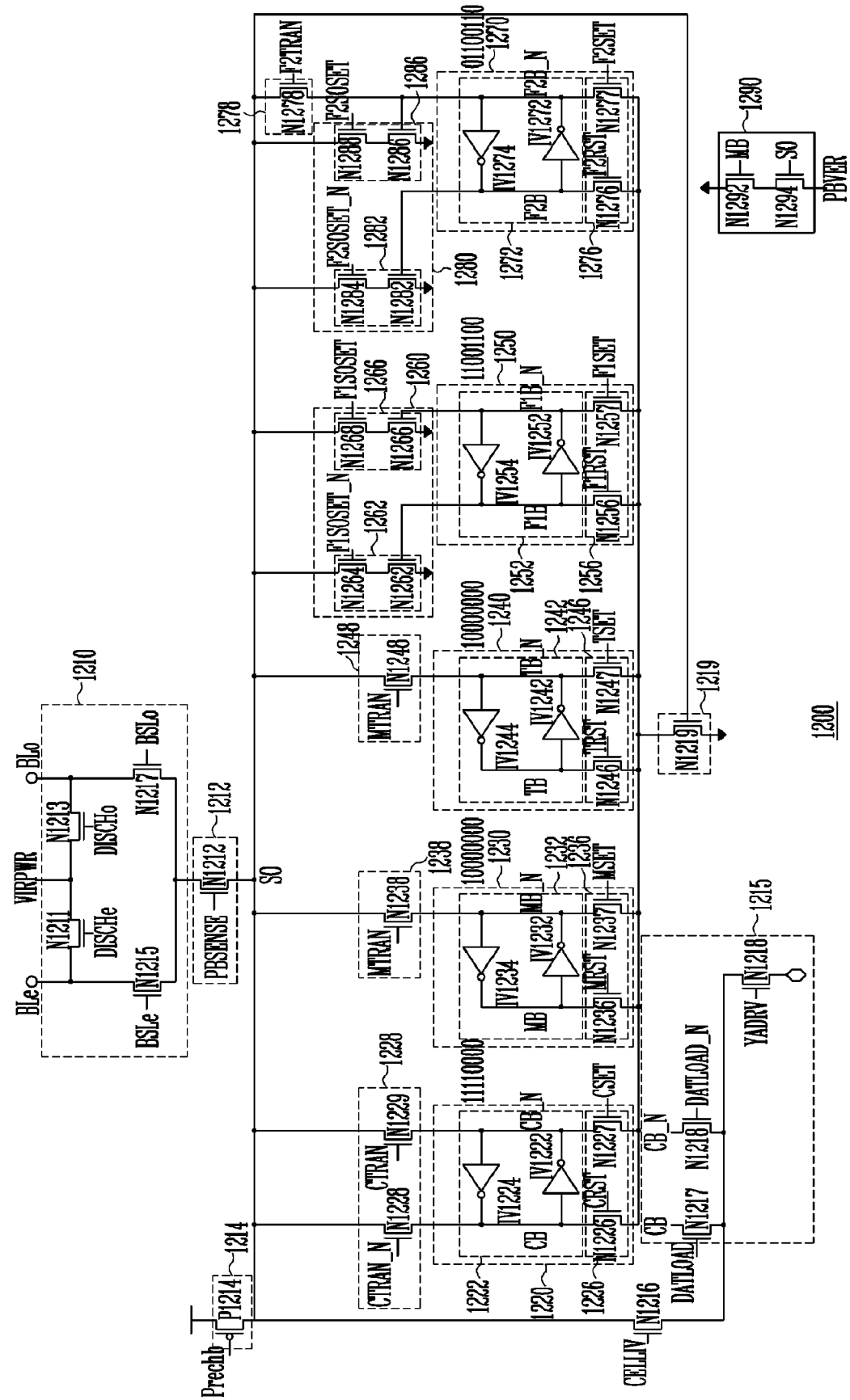
FIG. 12 is a view illustrating a page buffer in a non-volatile memory device according to still another exemplary embodiment of the present invention.

FIG. 12 is a view illustrating a page buffer in a non-volatile memory device according to still another exemplary embodiment of the present invention.

The page buffer 1200 of the present embodiment includes a bit line select circuit 1210, a bit line sensing circuit 1212, a sensing node precharging circuit 1214, a data inputting circuit 1215, a sensing node sensing circuit 1219, a first register 1220, a second register 1230, a third register 1240, a fourth register 1250, a fifth register 1270, a first data transmitting circuit 1228, a second data transmitting circuit 1238, a third data transmitting circuit 1248, a fourth data transmitting circuit 1278, a first sensing node discharging circuit 1260, a second sensing node discharging circuit 1280 and a pass/fail checking circuit 1290.

FIG. 12 is the page buffer 1200 for the program operation of the MLC having 3 bits unlike FIG. 2. The constitution of the page buffer 1200 is similar to that in FIG. 2. However, number of the registers and number of the discharging circuit are different from those in FIG. 2.

Hereinafter, the first and second sensing node discharging circuits 1260 and 1280 will be described in detail.

The first sensing node discharging circuit 1260 includes a first discharge circuit 1262 for coupling a sensing node SO to a ground in accordance with a first sensing node discharge signal F1SOSET_N and a first node F1B of the fourth register 1250 and a second discharge circuit 1266 for coupling the sensing node SO to the ground in accordance with a second sensing node discharge signal F1SOSET and a level of a second node F1B_N of the fourth register 1250.

The first discharge circuit 1262 has a first N-MOS transistor N1262 and a second N-MOS transistor N1264 coupled in series between the sensing node SO and the ground.

As shown in FIG. 12, the first N-MOS transistor N1262 coupled to the ground is turned on in accordance with the level of the first node F1B, and the second N-MOS transistor N1264 coupled to the sensing node SO is turned on in accordance with the first sensing node discharge signal F1SOSET_N. In another exemplary embodiment of the present invention, the first discharge circuit 1262 has different constitution, i.e. the first N-MOS transistor N1262 coupled to the ground is turned on in accordance with the first sensing node discharge signal F1SOSET_N and the second N-MOS transistor N1264 coupled to the sensing node SO is turned on in accordance with the level of the first node F1B. Accordingly, the sensing node is coupled (discharged) to the ground only when the first sensing node discharge signal F1SOSET_N is provided to corresponding N-MOS transistor and data stored in the first node F1B has high level.

The second discharge circuit 1266 has a third N-MOS transistor N1266 and a fourth N-MOS transistor N1268 coupled in series between the sensing node SO and the ground.

As shown in FIG. 12, the third N-MOS transistor N1266 coupled to the ground is turned on in accordance with a level of a second node F1B_N, and the fourth N-MOS transistor N1268 coupled to the sensing node SO is turned on in accordance with a second sensing node discharge signal F1SOSET. In another exemplary embodiment of the present invention, the second discharge circuit 1266 has different constitution, i.e. the third N-MOS transistor N1266 coupled to the ground is turned on in accordance with the second sensing node discharge signal F1SOSET and the fourth N-MOS transistor N1268 coupled to the sensing node SO is turned on in accordance with the level of the second node F1B_N. Accordingly, the sensing node is coupled (discharged) to the ground only when the second sensing node discharge signal F1SOSET is provided to corresponding N-MOS transistor and data stored in the second node F1B_N has high level.

The second sensing node discharging circuit 1280 includes a first discharge circuit 1282 for coupling the sensing node SO to the ground in accordance with a first sensing node discharge signal F2SOSET_N and a first node F2B of the fifth register 1270 and a second discharge circuit 1286 for coupling the sensing node SO to the ground in accordance with a second sensing node discharge signal F2SOSET and a level of a second node F2B_N of the fifth register 1270.

The first discharge circuit 1282 has a first N-MOS transistor N1282 and a second N-MOS transistor N1284 coupled in series between the sensing node SO and the ground.

As shown in FIG. 12, the first N-MOS transistor N1282 coupled to the ground is turned on in accordance with the level of the first node F2B, and the second N-MOS transistor N1284 coupled to the sensing node SO is turned on in accordance with the first sensing node discharge signal F2SOSET_N. In another exemplary embodiment of the present invention, the first discharge circuit 1282 has different constitution, i.e. the first N-MOS transistor N1282 coupled to the ground is turned on in accordance with the first sensing node discharge signal F2SOSET_N and the second N-MOS transistor N1284 coupled to the sensing node SO is turned on in accordance with the level of the first node F2B. Accordingly, the sensing node is coupled (discharged) to the ground only when the first sensing node discharge signal F2SOSET_N is provided to corresponding N-MOS transistor and data stored in the first node F2B has high level.

The second discharge circuit 1286 has a third N-MOS transistor N1286 and a fourth N-MOS transistor N1288 coupled in series between the sensing node SO and the ground.

As shown in FIG. 12, the third N-MOS transistor N1286 coupled to the ground is turned on in accordance with a level of a second node F2B_N, and the fourth N-MOS transistor N1288 coupled to the sensing node SO is turned on in accordance with a second sensing node discharge signal F2SOSET. In another exemplary embodiment of the present invention, the second discharge circuit 1286 has different constitution, i.e. the third N-MOS transistor N1286 coupled to the ground is turned on in accordance with the second sensing node discharge signal F2SOSET and the fourth N-MOS transistor N1288 coupled to the sensing node SO is turned on in accordance with the level of the second node F2B_N. Accordingly, the sensing node is coupled (discharged) to the ground only when the second sensing node discharge signal F2SOSET is provided to corresponding N-MOS transistor and data stored in the second node F2B_N has high level.

In short, the sensing node SO may be coupled to the ground through the first sensing node discharging circuit 1260 and the second sensing node discharging circuit 1280, and so maximum fourth distribution states may be separated. Accordingly, the sensing node SO may be coupled to the ground through data stored in the first register 1220, the first sensing node discharging circuit 1260 and the second sensing node discharging circuit 1280, and so maximum eighth distribution states may be separated.

The pass/fail checking circuit 1290 includes a first N-MOS transistor N1292 and a second N-MOS transistor N1294 coupled in series between a ground terminal and a verifying signal output terminal PBVER.

The first N-MOS transistor N1292 is turned on in accordance with a first node MB of the first register 1220, and the second N-MOS transistor N1294 is turned on a level of the sensing node SO. Accordingly, a ground voltage is outputted to the verifying signal output terminal PBVER in case that the sensing node SO and the first node MB have high level. This means that a fail signal is outputted because corresponding verifying operation is not completed.

FIG. 13 is a view illustrating a table indicating data set in each register in a non-volatile memory device according to still another exemplary embodiment of the present invention.

To maintain the memory cell with the seventh state in FIG. 11, data '1', '1', '1' and '0' are stored in a second node CB_N of the first register 1220, a second node MB_N of the second register 1230, the second node F1B_N of the fourth register 1250 and the second node F2B_N of the fifth register 1270, respectively.

Data in the table are stored in the memory cells to be programmed to the eight distribution state to the fourteenth distribution state. However, this setting may be changed in accordance with selection of a user. In other words, the above setting may be changed so that the seventh distribution state to the fourteenth distribution state are separated by using the data stored in the first register 1220, the fourth register 1250 and the fifth register 1270.

In case that the third bit program HSB are being performed about a page about which the first bit program LSB and the second bit program USB are finished, eight distribution states are existed as shown in FIG. 11.

Though the program voltage is applied to a word line coupled to the memory cells having the seventh distribution state, data of the second register 1230 is set so that a program inhibit operation is performed by maintaining a bit line to high level through the data of the second register 1230.

The data of the second register 1230 is set so that the bit line coupled to the memory cells to be programmed to the other distribution states is converted into low level in the data of the second register 1230, and thus the program operation is performed.

In brief, one of the seventh distribution state to the fourteenth distribution state may be embodied by combining the data in the first register 1220, the fourth register 1250 and the fifth register 1270.

Hereinafter, a method of verifying the program operation in the non-volatile memory device will be described in detail.

The verifying operation in FIG. 4 to FIG. 10 may be applied to the non-volatile memory device having the page buffer 1200 in FIG. 12. That is, in case of performing the second bit program operation USB in the page buffer 1200 having five registers 1220, 1230, 1240, 1250 and 1270, the MLC program operation of 2 bits may be performed by using the first register 1220 and the fourth register 1250 or the first register 1220 and the fifth register 1270.

Since the verifying operation described above is performed through two different registers and the sensing node discharging circuit for discharging the sensing node SO in accordance with the data stored in the specific register, it will be immediately obvious to those skilled in the art that the program operation may be performed in the page buffer 1200 in FIG. 12.

On the other hand, the MLC program operation for 2 bits may be applied to the MLC program operation for 3 bits.

FIG. 14A and FIG. 14B are views illustrating a verifying operation for a program operation in a non-volatile memory device according to one exemplary embodiment of the present invention.

FIG. 14A shows a process of performing pass/fail checking operations whenever verifying operations are performed as shown in FIG. 4. In other words, a first to seventh verifying operations are performed in sequence, and a corresponding pass/fail checking operation is performed whenever each of the verifying operation is performed.

FIG. 14B shows a process of performing the pass/fail checking operation after every verifying operation is performed as shown in FIG. 8. That is, the verifying operations are performed in sequence on the basis of a first to seventh verifying operations, and then a first to seventh pass/fail checking operations are performed in sequence after every verifying operation is performed.

The verifying operation of the present embodiment is similar to that described above, but number of the verifying operation and number of the verifying voltages in the present embodiment are different from those in other embodiment. Accordingly, detailed views shown in FIG. 5 and FIG. 9 will be omitted in the present embodiment.

Hereinafter, a process of coupling a sensing node SO corresponding to memory cells except specific memory cells of first to seventh verifying operation object memory cells to a ground will be described.

The process of coupling the sensing node SO to the ground is performed one time in the verifying operation as described above, and is performed one time in the pass/fail checking operation.

The verifying voltage is applied to every memory cell in the verifying operation, and then it is discriminated whether or not threshold voltages of the memory cells are higher than the verifying voltage. Accordingly, voltage level of the sensing node SO is determined, specific data is stored in the second register 1230 through the sensing node sensing circuit 1219. Here, the sensing node SO coupled to memory cells not the verifying operation object memory cells is coupled to the ground before the data is stored in the second register 1230. Then, result of the pass/fail checking operation is determined. In this case, the result is determined by only the verifying operation object memory cells.

FIG. 15 is a view illustrating a table recording control signals for coupling a sensing node to a ground according to one exemplary embodiment of the present invention. FIG. 16 is a view illustrating waveforms of control signals in a verifying operation according to another exemplary embodiment of the present invention.

In the first to third verifying operations, the sensing node SO for the fourth to seventh verifying operation object memory cells is coupled to the ground by providing the second data transmitting signal CTRAN. In other words, since data '0' is stored in the second node CB_N of the first register 1220, the sensing node SO is coupled to the ground.

As shown in FIG. 16, the sensing node SO for the fourth to seventh verifying operation object memory cells may be coupled to the ground by a specific data transmitting signal.

On the other hand, the sensing node SO, coupled to an erase object memory cell, the second verifying operation object memory cells and the third verifying operation object memory cells, should be coupled to the ground when the first verifying operation is performed.

Particularly, the first sensing node discharge signal F1SOSET_N having high level is provided to the first sensing node discharging circuit 1260, and the first sensing node discharge signal F2SOSET_N having high level is transmitted to the second sensing node discharging circuit 1280.

As shown in FIG. 15, in case of the first verifying operation object memory cells, the sensing node SO is not coupled to the ground though each of the sensing node discharge signals is provided because data '1' and data '1' are stored in the second node F1B_N of the fourth register 1250 and the second node F2B_N of the fifth register 1270 for the first verifying operation object memory cells, respectively.

However, in case of the second verifying operation object memory cells, the sensing node SO is coupled to the ground because data '0' is stored in the second node F1B_N of the fourth register 1250.

Additionally, in case of the third verifying operation object memory cells, the sensing node SO is coupled to the ground by the first sensing node discharge signal F1SOSET_N and the second sensing node discharge signal F2SOSET_N because data '0' and data '0' are stored in the second node F1B_N of the fourth register 1250 and the second node F2B_N of the fifth register 1270.

In case of the erase object memory cell, the sensing node SO is coupled to the ground by the second sensing node discharge signal F2SOSET_N because data '0' is stored in the second node F2B_N of the fifth register 1270.

As shown in FIG. 16, the sensing node SO, coupled to memory cells not to be verified, is coupled to the ground by providing two different sensing node discharge signals.

In FIG. 16, the data transmitting signal and the sensing node discharge signal are transmitted at different times. However, the signals may be transmitted at the same time.

In the second verifying operation, the sensing node SO, coupled to the erase object memory cell, the first verifying operation object memory cells and the third verifying operation object memory cells, should be coupled to the ground.

Particularly, the second sensing node discharge signal F1SOSET having high level is provided to the first sensing node discharging circuit 1260, and the first sensing node discharge signal F2SOSET_N having high level is transmitted to the second sensing node discharging circuit 1280.

As shown in FIG. 15, in case of the second verifying operation object memory cells, the sensing node SO is not coupled to the ground though each of the sensing node discharge signals is provided because data '0' and data '1' are stored in the second node F1B_N of the fourth register 1250 and the second node F2B_N of the fifth register 1270 for the second verifying operation object memory cells, respectively.

In the third verifying operation, the sensing node SO, coupled to the erase object memory cell, the first verifying operation object memory cells and the second verifying operation object memory cells, should be coupled to the ground.

Particularly, the second sensing node discharge signal F1SOSET having high level is provided to the first sensing node discharging circuit 1260, and the second sensing node discharge signal F2SOSET having high level is transmitted to the second sensing node discharging circuit 1280.

As shown in FIG. 15, the sensing node SO is not coupled to the ground though each of the sensing node discharge signals is provided because data '0' and data '0' are stored in the second node F1B_N of the fourth register 1250 and the second node F2B_N of the fifth register 1270 for the third verifying operation object memory cells, respectively. However, the sensing node SO, coupled to the erase memory cell, the first verifying operation object memory cells and the second verifying operation object memory cells, is coupled to the ground by the data stored in the fourth register 1250 and the fifth register 1270.

In the fourth to seventh verifying operations, the first data transmitting signal CTRAN_N having high level is provided, and so the sensing node SO, coupled to the erase object memory cell, the first to third verifying operation object memory cells, is coupled to the ground. Here, since data '1' are stored in the second node CB_N of the first register 1220 corresponding to each of the erase object memory cell, the first to third verifying operation object memory cells, corresponding sensing node SO is coupled to the ground. In one exemplary embodiment of the present invention, the sensing node SO corresponding to the erase object memory cell, the first to third verifying operation object memory cells is coupled to the ground by using the given data transmitting signal as shown in FIG. 16.

In the fourth verifying operation, the sensing node SO, coupled to the fifth to seventh verifying operation object memory cells, should be coupled to the ground.

Particularly, the first sensing node discharge signal F1SOSET_N having high level is provided to the first sensing node discharging circuit 1260, and the second sensing node discharge signal F2SOSET having high level is transmitted to the second sensing node discharging circuit 1280.

As shown in FIG. 15, the sensing node SO is not coupled to the ground though each of the sensing node discharge signals is provided because data '1' and data '0' are stored in the second node F1B_N of the fourth register 1250 and the second node F2B_N of the fifth register 1270 for the fourth verifying operation object memory cells, respectively. However, the sensing node SO, coupled to the fifth to seventh verifying operation object memory cells, is coupled to the ground by the data stored in the fourth register 1250 and the fifth register 1270.

In the fifth verifying operation, the sensing node SO, coupled to the fourth verifying operation object memory cells, the sixth verifying operation object memory cells and the seventh verifying operation object memory cells, should be coupled to the ground.

Particularly, the first sensing node discharge signal F1SOSET_N having high level is provided to the first sensing node discharging circuit 1260, and the first sensing node discharge signal F2SOSET_N having high level is transmitted to the second sensing node discharging circuit 1280.

As shown in FIG. 15, the sensing node SO is not coupled to the ground though each of the sensing node discharge signals is provided because data '1' and data '1' are stored in the second node F1B_N of the fourth register 1250 and the second node F2B_N of the fifth register 1270 for the fifth verifying operation object memory cells, respectively. However, the sensing node SO, coupled to the fourth verifying operation object memory cells, the sixth verifying operation object memory cells and the seventh verifying operation object memory cells, is coupled to the ground by the data stored in the fourth register 1250 and the fifth register 1270.

In the sixth verifying operation, the sensing node SO, coupled to the fourth verifying operation object memory cells, the fifth verifying operation object memory cells and the seventh verifying operation object memory cells, should be coupled to the ground.

Particularly, the second sensing node discharge signal F1SOSET having high level is provided to the first sensing node discharging circuit 1260, and the first sensing node discharge signal F2SOSET_N having high level is transmitted to the second sensing node discharging circuit 1280.

As shown in FIG. 15, the sensing node SO is not coupled to the ground though each of the sensing node discharge signals is provided because data '0' and data '1' are stored in the second node F1B_N of the fourth register 1250 and the second node F2B_N of the fifth register 1270 for the sixth verifying operation object memory cells, respectively. However, the sensing node SO, coupled to the fourth verifying operation object memory cells, the fifth verifying operation object memory cells and the seventh verifying operation object memory cells, is coupled to the ground by the data stored in the fourth register 1250 and the fifth register 1270.

In the seventh verifying operation, the sensing node SO, coupled to the fourth to sixth verifying operation object memory cells, should be coupled to the ground.

Particularly, the second sensing node discharge signal F1SOSET having high level is provided to the first sensing node discharging circuit 1260, and the second sensing node discharge signal F2SOSET having high level is transmitted to the second sensing node discharging circuit 1280.

As shown in FIG. 15, the sensing node SO is not coupled to the ground though each of the sensing node discharge signals is provided because data '0' and data '0' are stored in the second node F1B_N of the fourth register 1250 and the second node F2B_N of the fifth register 1270 for the seventh verifying operation object memory cells, respectively. However, the sensing node SO, coupled to the fourth to sixth verifying operation object memory cells, is coupled to the ground by the data stored in the fourth register 1250 and the fifth register 1270.

In brief, the sensing node SO, coupled to the memory cells not to be verified, is coupled to the ground in accordance with the data stored in the first register 1220, the fourth register 1250 and the fifth register 1270, the sensing node discharge signals F1SOSET, F1SOSET_N, F2SOSET or F2SOSET_N. As a result, the verifying operation and the pass/fail checking operation may be performed about only the memory cells to be verified.

Any reference in this specification to "one embodiment," "an embodiment," "exemplary embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A page buffer in a non-volatile memory device, the page buffer comprising:
    a first, a second and a third register;
    a first data transmitting circuit configured to transmit data stored in a first node or a second node of the first register to a sensing node in accordance with a first data transmitting signal or a second data transmitting signal; and
    a sensing node discharging circuit configured to couple the sensing node to a ground in accordance with data stored in a first node or a second node of the third register, and a first sensing node discharge signal or a second sensing node discharge signal.

2. The page buffer of claim 1, wherein an erase object memory cell and first to third verifying operation object memory cells are specified in accordance with the data stored in the first register and the third register.

3. The page buffer of claim 1, wherein the sensing node is coupled to the ground in accordance with the first data transmitting signal in case that data '1' is stored in the first node of the first register, and the sensing node is coupled to the ground in accordance with the second data transmitting signal in case that data '1' is stored in the second node of the first register.

4. The page buffer of claim 1, wherein the sensing node discharging circuit includes:
    a first discharge circuit configured to couple the sensing node to the ground in accordance with the data stored in the first node of the third register and the first sensing node discharge signal; and
    a second discharge circuit configured to couple the sensing node to the ground in accordance with the data stored in the second node of the third register and the second sensing node discharge signal.

5. The page buffer of claim 4, wherein the first discharge circuit has a first switching element and a second switching element coupled in series between the sensing node and the ground, and the second discharge circuit includes a third switching element and a fourth switching element coupled in series between the sensing node and the ground,
    and wherein the first switching element is turned on in accordance with the first sensing node discharge signal, the second switching element is turned on in accordance with the data stored in the first node of the third register, the third switching element is turned on in accordance with the second sensing node discharge signal, and the fourth switching element is turned on in accordance with the data stored in the second node of the third register.

6. The page buffer of claim 1, wherein the sensing node discharging circuit couples the sensing node to the ground in accordance with the first sensing node discharge signal in case that data '1' is stored in the first node of the third register, and couples the sensing node to the ground in accordance with the second sensing node discharge signal in case that data '1' is stored in the second node of the third register.

7. The page buffer of claim 1, further comprising:
    a pass/fail checking circuit configured to output a verifying finish signal in accordance with data stored in a specific node of the second register and voltage level of the sensing node.

8. The page buffer of claim 7, wherein the pass/fail checking circuit has a first switching element and a second switching element coupled in series between a ground terminal and a verifying finish signal output terminal,
    and wherein the first switching element is turned on in accordance with the data stored in the specific node of the second register, and the second switching element is turned on in accordance with the voltage level of the sensing node.

9. The page buffer of claim 8, wherein in case that a verifying operation is completed, the pass/fail checking circuit turns off the second switching element, thereby floating the verifying finish signal output terminal.

10. A page buffer in a non-volatile memory device for performing a program operation for a multi level cell having m bits, the page buffer comprising:
    a first register to an mth register;
    a first data transmitting circuit configured to transmit data stored in a first node or a second node of the first register to a sensing node in accordance with a first data transmitting signal or a second data transmitting signal; and
    (m-1) sensing node discharging circuits configured to couple the sensing node to a ground in accordance with data stored in a first node or a second node of each of the second register to the mth register, and a first sensing node discharge signal or a second sensing node discharge signal.

11. The page buffer of claim 10, wherein the first register stores data for separating a memory cell to be programmed to a first distribution state to a $2^{m-1}$ distribution state from a memory cell to be programmed to a $(2^{m-1}+1)$ distribution state to a $2^m$ distribution state.

12. The page buffer of claim 10, wherein the sensing node discharging circuits couples the sensing node coupled to the other verifying operation object memory cells except specific verifying operation object memory cells of $2^{m-1}$ verifying operation object memory cells to a ground.

13. The page buffer of claim 10, wherein the sensing node coupled to the other verifying operation object memory cells except specific verifying operation object memory cells of $2^{m-1}$ verifying operation object memory cells is coupled to a ground in accordance with data stored in the first register to the mth register.

14. A page buffer in a non-volatile memory device, the page buffer comprising:
    a first register to a fifth register;
    a first data transmitting circuit configured to transmit data stored in a first node or a second node of the first register to a corresponding sensing node in accordance with a first data transmitting signal or a second data transmitting signal;
    a first sensing node discharging circuit configured to couple a corresponding sensing node to the ground in accordance with data stored in a first node or a second node of the fourth register, and a first sensing node discharge signal or a second sensing node discharge signal; and
    a second sensing node discharging circuit configured to couple a corresponding sensing node to the ground in accordance with data stored in a first node or a second node of the fifth register, and a third sensing node discharge signal or a fourth sensing node discharge signal.

15. The page buffer of claim 14, wherein an erase object memory cell, first verifying operation object memory cells and seventh verifying operation object memory cells are specified in accordance with data stored in the first register, the fourth register and the fifth register.

16. The page buffer of claim 14, wherein the sensing node is coupled to the ground in accordance with the first data transmitting signal in case that data '1' is stored in the first node of the first register, and the sensing node is coupled to the ground in accordance with the second data transmitting signal in case that data '1' is stored in the second node of the first register.

17. The page buffer of claim 14, wherein the first sensing node discharging circuit includes:
   a first discharge circuit configured to couple the sensing node to the ground in accordance with the data stored in the first node of the fourth register and the first sensing node discharge signal; and
   a second discharge circuit configured to couple the sensing node to the ground in accordance with the data stored in the second node of the fourth register and the second sensing node discharge signal.

18. The page buffer of claim 14, wherein the second sensing node discharging circuit includes:
   a third discharge circuit configured to couple the sensing node to the ground in accordance with the data stored in the first node of the fifth register and the third sensing node discharge signal; and
   a fourth discharge circuit configured to couple the sensing node to the ground in accordance with the data stored in the second node of the fifth register and the second sensing node discharge signal.

19. The page buffer of claim 17, wherein the first discharge circuit includes a first switching element coupled in series between the sensing node and the ground, and the second discharge circuit has a third switching element and a fourth switching element coupled in series between the sensing node and the ground,
   and wherein the first switching element is turned on in accordance with the first sensing node discharge signal, the second switching element is turned on in accordance with the data stored in the first node of the fourth register, a third switching element is turned on in accordance with the second sensing node discharge signal, and the fourth switching element is turned on in accordance with the data stored in the second node of the fourth register.

20. The page buffer of claim 18, wherein the third discharge circuit includes a first switching element coupled in series between the sensing node and the ground, and the fourth discharge circuit has a third switching element and a fourth switching element coupled in series between the sensing node and the ground,
   and wherein the first switching element is turned on in accordance with the third sensing node discharge signal, the second switching element is turned on in accordance with the data stored in the first node of the fifth register, a third switching element is turned on in accordance with the fourth sensing node discharge signal, and the fourth switching element is turned on in accordance with the data stored in the second node of the fifth register.

21. The page buffer of claim 14, wherein the first sensing node discharging circuit couples the sensing node to the ground in accordance with the first sensing node discharge signal in case that data '1' is stored in the first node of the fourth register, and couples the sensing node to the ground in accordance with the second sensing node discharge signal in case that data '1' is stored in the second node of the fourth register.

22. The page buffer of claim 14, wherein the second sensing node discharging circuit couples the sensing node to the ground in accordance with the third sensing node discharge signal in case that data '1' is stored in the first node of the fifth register, and couples the sensing node to the ground in accordance with the fourth sensing node discharge signal in case that data '1' is stored in the second node of the fifth register.

23. A method of verifying a program operation in a non-volatile memory device, the method comprising:
   detecting level of threshold voltages of program object memory cells by applying a first verifying voltage;
   coupling sensing nodes coupled to memory cells except a first verifying operation object memory cells to a ground;
   converting data stored in a register in accordance with state of the first verifying operation object memory cells;
   precharging sensing nodes coupled to every memory cell to high level;
   coupling the sensing nodes coupled to the memory cells except the first verifying operation object memory cells; and
   verifying pass/fail of a verifying operation in accordance with the data stored in the register coupled to the first verifying operation object memory cells.

24. A method of verifying a program operation in a non-volatile memory device, the method comprising:
   performing a program operation in accordance with a first program voltage;
   performing a first verifying operation by applying a first verifying voltage;
   verifying pass/fail of the first verifying operation in accordance with data stored in a second register coupled to first verifying operation object memory cells;
   performing a second verifying operation by applying a second verifying voltage;
   verifying pass/fail of the second verifying operation in accordance with the data stored in the second register coupled to second verifying operation object memory cells;
   performing a third verifying operation by applying a third verifying voltage; and
   verifying pass/fail of the third verifying operation in accordance with the data stored in the second register coupled to third verifying operation object memory cells,
   wherein the steps of performing the verifying operations and the steps of verifying the pass/fail include coupling a sensing node coupled to memory cells except a corresponding verifying operation object memory cells to a ground.

25. The method of claim 24, wherein the step of performing the first verifying operation includes:
   detecting levels of threshold voltages of program object memory cells by applying the first verifying voltage;
   coupling the sensing nodes coupled to the memory cells except the first verifying operation object memory cells to the ground; and
   converting data stored in the second register in accordance with state of the first verifying operation object memory cells.

26. The method of claim 25, wherein the coupling the sensing nodes coupled to the memory cells except the first verifying operation object memory cells includes:
   coupling sensing nodes coupled to second and third verifying operation object memory cells to the ground by transmitting a second data transmitting signal.

27. The method of claim 24, wherein the step of performing the second verifying operation includes:
   detecting levels of the threshold voltages of the program object memory cells by applying the second verifying voltage;
   coupling the sensing nodes coupled to the memory cells except the second verifying operation object memory cells to the ground; and converting data stored in the second register in accordance with state of the second verifying operation object memory cells.

28. The method of claim 27, wherein the coupling the sensing nodes coupled to the memory cells except the second verifying operation object memory cells includes:
coupling sensing nodes coupled to an erase object memory cell and the first verifying operation object memory cells to the ground by transmitting a first data transmitting signal; and
coupling sensing nodes coupled to the third verifying operation object memory cells by providing a first sensing node discharge signal.

29. The method of claim 24, wherein the step of performing the third verifying operation includes:
detecting levels of the threshold voltages of the program object memory cells by applying the third verifying voltage;
coupling the sensing nodes coupled to the memory cells except the third verifying operation object memory cells to the ground; and
converting data stored in the second register in accordance with corresponding states of the third verifying operation object memory cells.

30. The method of claim 29, wherein the coupling the sensing nodes coupled to the memory cells except the third verifying operation object memory cells includes:
coupling sensing nodes coupled to an erase object memory cell and the first verifying operation object memory cells to the ground by transmitting a first data transmitting signal; and
coupling sensing nodes coupled to the second verifying operation object memory cells by providing a second sensing node discharge signal.

31. The method of claim 24, wherein the step of verifying the pass/fail of the first verifying operation includes:
precharging sensing nodes coupled to every memory cell to high level;
coupling the sensing nodes coupled to memory cells except the first verifying operation object memory cells to the ground; and
verifying whether or not every data stored in the second register coupled to the first verifying operation object memory cells is first data.

32. The method of claim 31, wherein the coupling the sensing nodes coupled to the memory cells except the first verifying operation object memory cells includes:
coupling sensing nodes coupled to second and third verifying operation object memory cells to the ground by transmitting a second data transmitting signal.

33. The method of claim 24, wherein the step of verifying the pass/fail of the second verifying operation includes:
precharging sensing nodes coupled to every memory cell to high level;
coupling the sensing nodes coupled to memory cells except the second verifying operation object memory cells to the ground; and
verifying whether or not every data stored in the second register coupled to the second verifying operation object memory cells is first data.

34. The method of claim 33, wherein the coupling the sensing nodes coupled to the memory cells except the second verifying operation object memory cells includes:
coupling sensing nodes coupled to an erase object memory cell and the first verifying operation object memory cells to the ground by transmitting a first data transmitting signal; and
coupling sensing nodes coupled to the third verifying operation object memory cells by providing a first sensing node discharge signal.

35. The method of claim 24, wherein the step of verifying the pass/fail of the third verifying operation includes:
precharging sensing nodes coupled to every memory cell to high level;
coupling the sensing nodes coupled to memory cells except the third verifying operation object memory cells to the ground; and
verifying whether or not every data stored in the second register coupled to the third verifying operation object memory cells is first data.

36. The method of claim 35, wherein the coupling the sensing nodes coupled to the memory cells except the third verifying operation object memory cells includes:
coupling sensing nodes coupled to an erase object memory cell and the first verifying operation object memory cells to the ground by transmitting a first data transmitting signal; and
coupling sensing nodes coupled to the second verifying operation object memory cells by providing a second sensing node discharge signal.

37. The method of claim 24, further comprising:
performing the program operation in accordance with a second program voltage increased by a step voltage from the first program voltage in case that a memory cell having fail state of the first to third verifying operation object memory cells exists; and
performing repeatedly the program operation until every first to third verifying operation object memory cell is passed.

38. The method of claim 24, further comprising:
performing the program operation in accordance with a second program voltage increased by a step voltage from the first program voltage in case that a memory cell having fail state of the first to third verifying operation object memory cells exists; and
performing repeatedly the program operation until every first to third verifying operation object memory cell is passed;
wherein in case that specific verifying operation memory cells are passed, the step of verifying the that specific verifying operation memory cells and the step of verifying the pass/fail of that specific verifying operation memory cells are omitted.

39. A method of verifying a program operation in a non-volatile memory device, the method comprising:
performing a program operation in accordance with a first program voltage;
performing a first verifying operation by applying a first verifying voltage;
performing a second verifying operation by applying a second verifying voltage;
performing a third verifying operation by applying a third verifying voltage;
verifying pass/fail of the first verifying operation in accordance with data stored in a second register coupled to first verifying operation object memory cells;
verifying pass/fail of the second verifying operation in accordance with the data stored in the second register coupled to second verifying operation object memory cells; and
verifying pass/fail of the third verifying operation in accordance with the data stored in the second register coupled to third verifying operation object memory cells, wherein the steps of performing the verifying operations and the steps of verifying the pass/fail include coupling a sensing node coupled to memory cells except a corresponding verifying operation object memory cells to a ground.

40. The method of claim 39, wherein the step of performing the first verifying operation includes:
   detecting levels of threshold voltages of program object memory cells by applying the first verifying voltage;
   coupling the sensing nodes coupled to the memory cells except the first verifying operation object memory cells to the ground; and
   converting data stored in the second register in accordance with state of the first verifying operation object memory cells.

41. The method of claim 40, wherein the coupling the sensing nodes coupled to the memory cells except the first verifying operation object memory cells includes:
   coupling sensing nodes coupled to second and third verifying operation object memory cells to the ground by transmitting a second data transmitting signal.

42. The method of claim 39, wherein the step of performing the second verifying operation includes:
   detecting levels of the threshold voltages of the program object memory cells by applying the second verifying voltage;
   coupling the sensing nodes coupled to the memory cells except the second verifying operation object memory cells to the ground; and
   converting data stored in the second register in accordance with state of the second verifying operation object memory cells.

43. The method of claim 42, wherein the coupling the sensing nodes coupled to the memory cells except the second verifying operation object memory cells includes:
   coupling sensing nodes coupled to an erase object memory cell and the first verifying operation object memory cells to the ground by transmitting a first data transmitting signal; and
   coupling sensing nodes coupled to the third verifying operation object memory cells by providing a first sensing node discharge signal.

44. The method of claim 39, wherein the step of performing the third verifying operation includes:
   detecting levels of the threshold voltages of the program object memory cells by applying the third verifying voltage;
   coupling the sensing nodes coupled to the memory cells except the third verifying operation object memory cells to the ground; and
   converting data stored in the second register in accordance with state of the third verifying operation object memory cells.

45. The method of claim 44, wherein the coupling the sensing nodes coupled to the memory cells except the third verifying operation object memory cells includes:
   coupling sensing nodes coupled to an erase object memory cell and the first verifying operation object memory cells to the ground by transmitting a first data transmitting signal; and
   coupling sensing nodes coupled to the second verifying operation object memory cells by providing a second sensing node discharge signal.

46. The method of claim 39, wherein the step of verifying the pass/fail of the first verifying operation includes:
   precharging sensing nodes coupled to every memory cell to high level;
   coupling the sensing nodes coupled to memory cells except the first verifying operation object memory cells to the ground; and
   verifying whether or not every data stored in the second register coupled to the first verifying operation object memory cells is first data.

47. The method of claim 46, wherein the coupling the sensing nodes coupled to the memory cells except the first verifying operation object memory cells includes:
   coupling sensing nodes coupled to second and third verifying operation object memory cells to the ground by transmitting a second data transmitting signal.

48. The method of claim 39, wherein the step of verifying the pass/fail of the second verifying operation includes:
   precharging sensing nodes coupled to every memory cell to high level;
   coupling the sensing nodes coupled to memory cells except the second verifying operation object memory cells to the ground; and
   verifying whether or not every data stored in the second register coupled to the second verifying operation object memory cells is first data.

49. The method of claim 48, wherein the coupling the sensing nodes coupled to the memory cells except the second verifying operation object memory cells includes:
   coupling sensing nodes coupled to an erase object memory cell and the first verifying operation object memory cells to the ground by transmitting a first data transmitting signal; and
   coupling sensing nodes coupled to the third verifying operation object memory cells by providing a first sensing node discharge signal.

50. The method of claim 39, wherein the step of verifying the pass/fail of the third verifying operation includes:
   precharging sensing nodes coupled to every memory cell to high level;
   coupling the sensing nodes coupled to memory cells except the third verifying operation object memory cells to the ground; and
   verifying whether or not every data stored in the second register coupled to the third verifying operation object memory cells is first data.

51. The method of claim 50, wherein the coupling the sensing nodes coupled to the memory cells except the third verifying operation object memory cells includes:
   coupling sensing nodes coupled to an erase object memory cell and the first verifying operation object memory cells to the ground by transmitting a first data transmitting signal; and
   coupling sensing nodes coupled to the second verifying operation object memory cells by providing a second sensing node discharge signal.

52. The method of claim 39, further comprising:
   performing the program operation in accordance with a second program voltage increased by a step voltage from the first program voltage in case that a memory cell having fail state of the first to third verifying operation object memory cells exists; and
   performing repeatedly the program operation until every first to third verifying operation object memory cell is passed.

53. The method of claim 39, further comprising:
   performing the program operation in accordance with a second program voltage increased by a step voltage from the first program voltage in case that a memory cell having fail state of the first to third verifying operation object memory cells exists; and performing repeatedly the program operation until every first to third verifying operation object memory cell is passed;

wherein in case that specific verifying operation memory cells are passed, the step of verifying the that specific verifying operation memory cells and the step of verifying the pass/fail of that specific verifying operation memory cells are omitted.

54. A method of verifying a program operation in a nonvolatile memory device, the method comprising:

performing a program operation in accordance with a first program voltage;

performing a first verifying operation by applying a first verifying voltage;

verifying pass/fail of the first verifying operation in accordance with data stored in a second register coupled to first verifying operation object memory cells;

performing a second verifying operation by applying a second verifying voltage;

verifying pass/fail of the second verifying operation in accordance with the data stored in the second register coupled to second verifying operation object memory cells;

performing a third verifying operation by applying a third verifying voltage;

verifying pass/fail of the third verifying operation in accordance with the data stored in the second register coupled to third verifying operation object memory cells;

performing a fourth verifying operation by applying a fourth verifying voltage;

verifying pass/fail of the fourth verifying operation in accordance with the data stored in the second register coupled to fourth verifying operation object memory cells;

performing a fifth verifying operation by applying a fifth verifying voltage;

verifying pass/fail of the fifth verifying operation in accordance with the data stored in the second register coupled to fifth verifying operation object memory cells;

performing a sixth verifying operation by applying a third verifying voltage;

verifying pass/fail of the sixth verifying operation in accordance with the data stored in the second register coupled to sixth verifying operation object memory cells;

performing a seventh verifying operation by applying a seventh verifying voltage; and verifying pass/fail of the seventh verifying operation in accordance with the data stored in the second register coupled to seventh verifying operation object memory cells, wherein the steps of performing the verifying operations and the steps of verifying the pass/fail include coupling a sensing node coupled to memory cells except a corresponding verifying operation object memory cells to a ground.

55. A method of verifying a program operation in a nonvolatile memory device, the method comprising:

performing a program operation in accordance with a first program voltage;

performing a first verifying operation by applying a first verifying voltage;

performing a second verifying operation by applying a second verifying voltage;

performing a third verifying operation by applying a third verifying voltage;

performing a fourth verifying operation by applying a fourth verifying voltage;

performing a fifth verifying operation by applying a fifth verifying voltage;

performing a sixth verifying operation by applying a sixth verifying voltage;

performing a seventh verifying operation by applying a seventh verifying voltage;

verifying pass/fail of the first verifying operation in accordance with data stored in a second register coupled to first verifying operation object memory cells;

verifying pass/fail of the second verifying operation in accordance with the data stored in the second register coupled to second verifying operation object memory cells;

verifying pass/fail of the third verifying operation in accordance with the data stored in the second register coupled to third verifying operation object memory cells;

verifying pass/fail of the fourth verifying operation in accordance with data stored in the second register coupled to fourth verifying operation object memory cells;

verifying pass/fail of the fifth verifying operation in accordance with the data stored in the second register coupled to fifth verifying operation object memory cells;

verifying pass/fail of the sixth verifying operation in accordance with the data stored in the second register coupled to sixth verifying operation object memory cells; and verifying pass/fail of the seventh verifying operation in accordance with the data stored in the second register coupled to seventh verifying operation object memory cells, wherein the steps of performing the verifying operations and the steps of verifying the pass/fail include coupling a sensing node coupled to memory cells except a corresponding verifying operation object memory cells to a ground.

* * * * *